(12) United States Patent  (10) Patent No.: US 7,879,186 B2
Lindley et al.  (45) Date of Patent: Feb. 1, 2011

(54) METHOD AND APPARATUS FOR SHAPING A MAGNETIC FIELD IN A MAGNETIC FIELD-ENHANCED PLASMA REACTOR

(75) Inventors: Roger Alan Lindley, Santa Clara, CA (US); Jingbao Liu, Sunnyvale, CA (US); Bryan Y. Pu, San Jose, CA (US); Keiji Horioka, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 12/204,408

(22) Filed: Sep. 4, 2008

(65) Prior Publication Data

US 2009/0008033 A1    Jan. 8, 2009

Related U.S. Application Data

(63) Continuation of application No. 10/778,933, filed on Feb. 13, 2004, now Pat. No. 7,422,654.

(60) Provisional application No. 60/447,431, filed on Feb. 14, 2003.

(51) Int. Cl.
C23F 1/00      (2006.01)
C23C 16/00    (2006.01)
H01L 21/306  (2006.01)

(52) U.S. Cl. ............................... 156/345.46; 118/723 E

(58) Field of Classification Search ............ 156/345.41, 156/345.42, 345.43, 345.46, 345.48, 345.49; 118/715, 722, 723 E, 723 MW, 723 MA
See application file for complete search history.

(56) References Cited

U.S. PATENT DOCUMENTS

| | | | |
|---|---|---|---|
| 4,526,643 A | 7/1985 | Okano et al. | |
| 4,552,639 A | 11/1985 | Garrett | |
| 4,600,492 A | 7/1986 | Ooshio et al. | |
| 4,631,106 A | 12/1986 | Nakazato et al. | |
| 4,668,338 A | 5/1987 | Maydan et al. | |
| 4,668,365 A | 5/1987 | Foster et al. | |
| 4,740,268 A | 4/1988 | Bukhman | |
| 4,826,585 A | 5/1989 | Davis | |
| 4,829,215 A | 5/1989 | Kim et al. | |
| 4,842,683 A | 6/1989 | Cheng et al. | |
| 4,919,783 A | 4/1990 | Asamaki et al. | |
| 4,950,956 A | 8/1990 | Asamaki et al. | |
| 4,963,242 A | 10/1990 | Sato et al. | |
| 4,985,679 A | 1/1991 | McDougall | |
| 5,012,192 A | 4/1991 | Siebold | |
| 5,032,202 A | 7/1991 | Tsai et al. | |
| 5,061,838 A | 10/1991 | Lane et al. | |
| 5,079,481 A | 1/1992 | Moslehi | |
| 5,081,398 A | 1/1992 | Asmussen et al. | |
| 5,087,857 A | 2/1992 | Ahn | |
| 5,122,251 A | 6/1992 | Campbell et al. | |
| 5,147,520 A | 9/1992 | Bobbio | |
| 5,208,512 A | 5/1993 | Forster et al. | |
| 5,211,825 A | 5/1993 | Saito et al. | |

(Continued)

*Primary Examiner*—Maureen Gramaglia
(74) *Attorney, Agent, or Firm*—Moser IP Law Group

(57) ABSTRACT

A magnetic field generator which provides greater control over the magnetic field is provided. The magnetic field generator has a plurality of overlapping main magnetic coil sections for forming a magnetic field generally parallel to the top surface of the supporting member. In other embodiments, sub-magnetic coil sections are placed symmetrically around the main magnetic coil sections.

8 Claims, 20 Drawing Sheets

U.S. PATENT DOCUMENTS

| | | | |
|---|---|---|---|
| 5,215,619 A | 6/1993 | Cheng et al. |
| 5,225,024 A | 7/1993 | Hanley et al. |
| 5,252,194 A | 10/1993 | Demaray et al. |
| 5,304,279 A | 4/1994 | Coultas et al. |
| 5,308,417 A | 5/1994 | Groechel et al. |
| 5,444,207 A | 8/1995 | Sekine et al. |
| 5,449,977 A | 9/1995 | Nakagawa et al. |
| 5,519,373 A | 5/1996 | Miyata |
| 5,534,108 A | 7/1996 | Qian et al. |
| 5,659,276 A | 8/1997 | Miyata |
| 5,674,321 A | 10/1997 | Pu et al. |
| 5,717,294 A | 2/1998 | Sakai et al. |
| 5,718,795 A | 2/1998 | Plavidal et al. |
| 5,783,102 A | 7/1998 | Keller |
| 5,798,029 A | 8/1998 | Morita |
| 5,855,725 A | 1/1999 | Sakai |
| 5,876,576 A | 3/1999 | Fu |
| 5,902,461 A | 5/1999 | Xu et al. |
| 5,907,220 A | 5/1999 | Tepman et al. |
| 5,945,008 A | 8/1999 | Kisakibaru et al. |
| 6,014,943 A | 1/2000 | Arami et al. |
| 6,015,476 A | 1/2000 | Schlueter et al. |
| 6,030,486 A | 2/2000 | Loewenhardt et al. |
| 6,051,151 A | 4/2000 | Keller et al. |
| 6,063,236 A | 5/2000 | Sakai |
| 6,082,293 A | 7/2000 | Kawashima |
| 6,085,688 A | 7/2000 | Lymberopoulos et al. |
| 6,099,687 A | 8/2000 | Yamazaki |
| 6,113,731 A | 9/2000 | Shan et al. |
| 6,143,140 A | 11/2000 | Wang et al. |
| 6,164,240 A | 12/2000 | Nikulin |
| 6,190,495 B1 | 2/2001 | Kubota et al. |
| 6,228,235 B1 | 5/2001 | Tepman et al. |
| 6,247,425 B1 | 6/2001 | Lymberopoulos et al. |
| 6,251,242 B1 | 6/2001 | Fu et al. |
| 6,255,220 B1 | 7/2001 | Kisakibaru et al. |
| 6,274,008 B1 | 8/2001 | Gopalraja et al. |
| 6,277,249 B1 | 8/2001 | Gopalraja et al. |
| 6,296,747 B1 | 10/2001 | Tanaka |
| 6,300,227 B1 | 10/2001 | Liu et al. |
| 6,322,661 B1 | 11/2001 | Bailey, III et al. |
| 6,376,388 B1 | 4/2002 | Hashimoto et al. |
| 6,382,129 B1 | 5/2002 | Nikulin |
| 6,436,230 B1 | 8/2002 | Kondo et al. |
| 6,444,104 B2 | 9/2002 | Gopalraja et al. |
| 6,451,177 B1 | 9/2002 | Gopalraja et al. |
| 6,485,617 B2 | 11/2002 | Fu et al. |
| 6,485,618 B2 | 11/2002 | Gopalraja et al. |
| 6,488,807 B1 | 12/2002 | Collins et al. |
| 6,491,801 B1 | 12/2002 | Gung |
| 6,495,009 B1 | 12/2002 | Gung |
| 6,521,082 B1 | 2/2003 | Barnes et al. |
| 6,528,751 B1 | 3/2003 | Hoffman et al. |
| 6,545,580 B2 | 4/2003 | Hegde et al. |
| 6,579,421 B1 | 6/2003 | Fu |
| 6,599,399 B2 | 7/2003 | Xu et al. |
| 6,610,184 B2 | 8/2003 | Ding et al. |
| 6,613,689 B2 | 9/2003 | Liu et al. |
| 6,627,050 B2 | 9/2003 | Miller et al. |
| 6,663,754 B2 | 12/2003 | Gung |
| 6,673,199 B1 | 1/2004 | Yamartino et al. |
| 6,716,302 B2 | 4/2004 | Carducci et al. |
| 6,761,804 B2 | 7/2004 | Perrin |
| 6,764,575 B1 | 7/2004 | Yamasaki et al. |
| 6,787,006 B2 | 9/2004 | Gopalraja et al. |
| 6,797,639 B2 | 9/2004 | Carducci et al. |
| 6,805,770 B1 | 10/2004 | Oster |
| 6,937,127 B2 | 8/2005 | Oster |
| 2003/0006008 A1 | 1/2003 | Horioka et al. |
| 2003/0085000 A1 | 5/2003 | Horioka et al. |
| 2004/0182516 A1 | 9/2004 | Lindley et al. |
| 2005/0167051 A1 | 8/2005 | Hoffman |

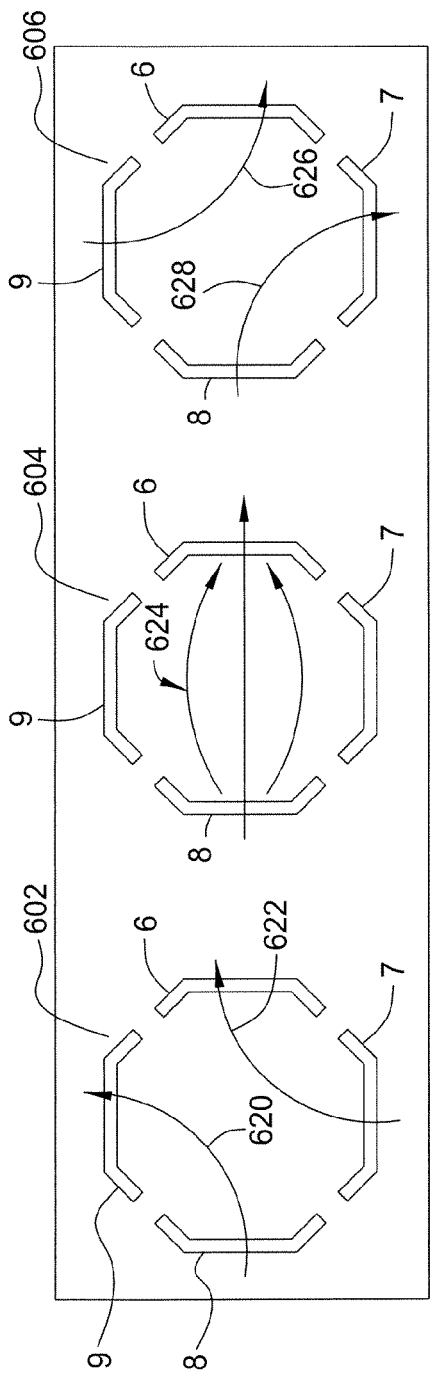
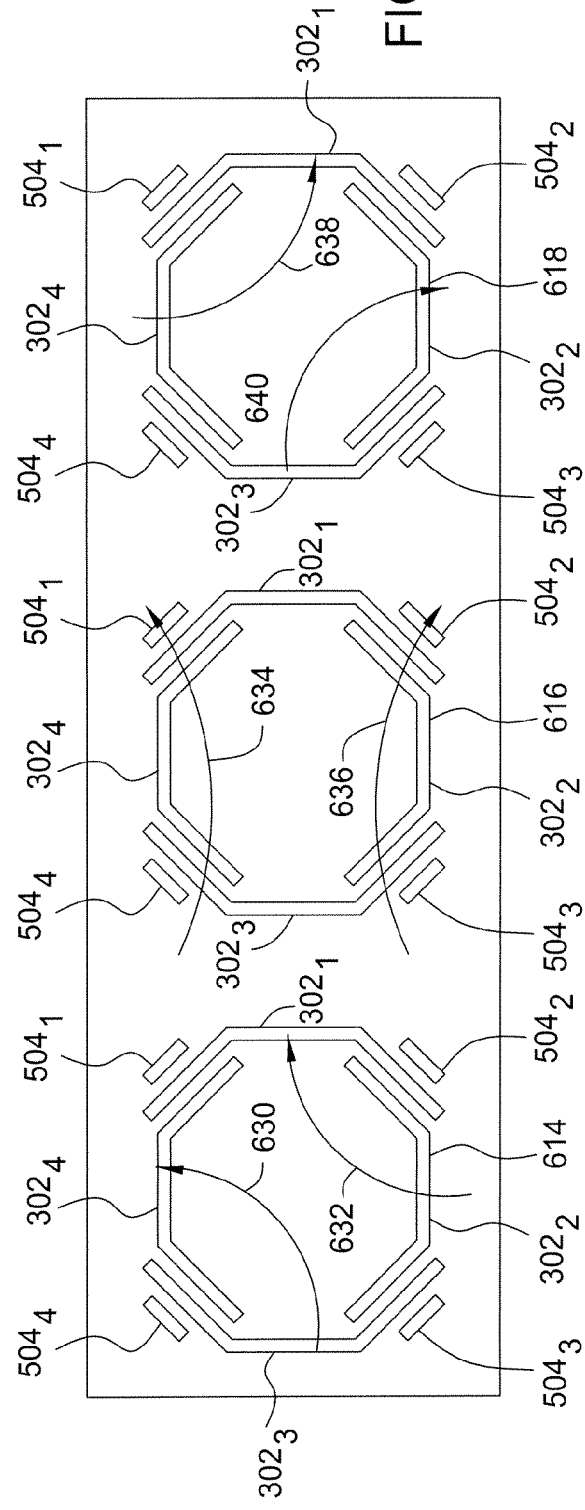
FIG. 8A (PRIOR ART)
FIG. 8B

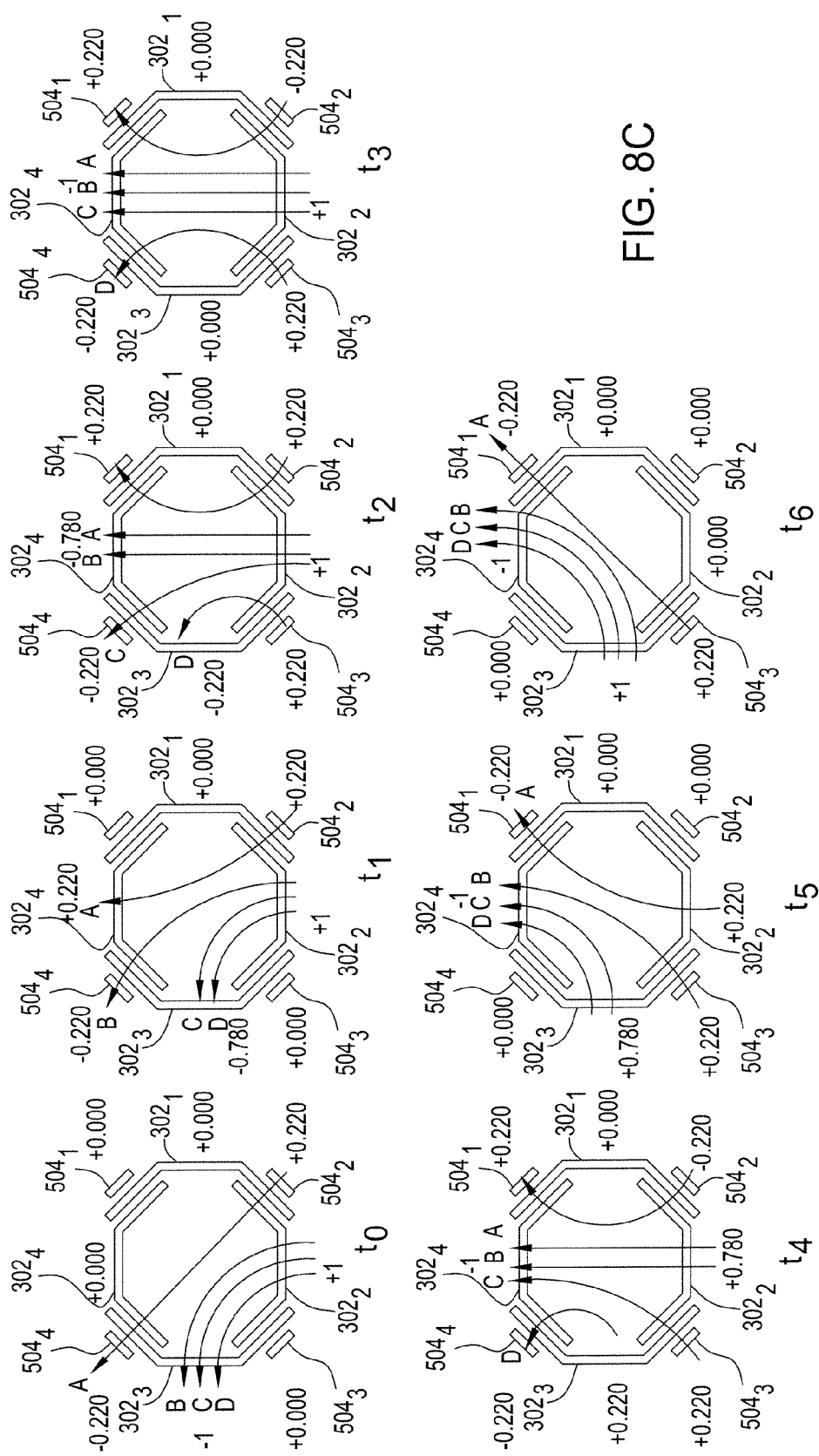

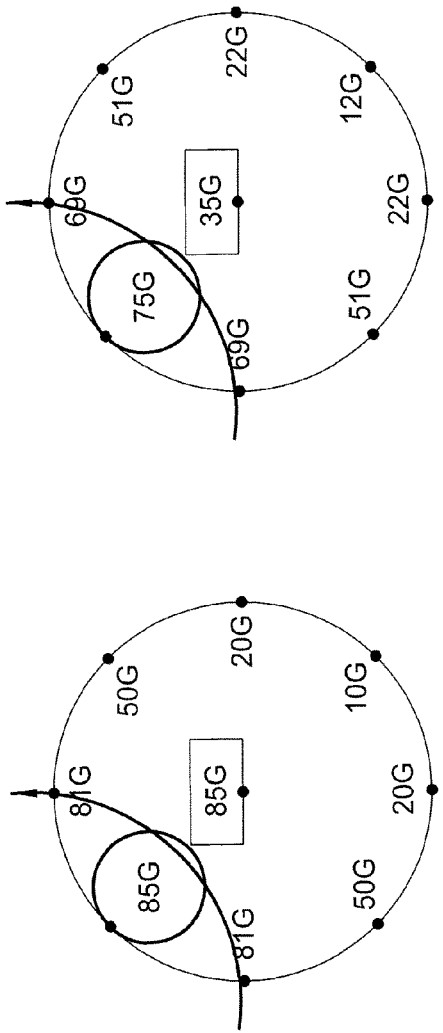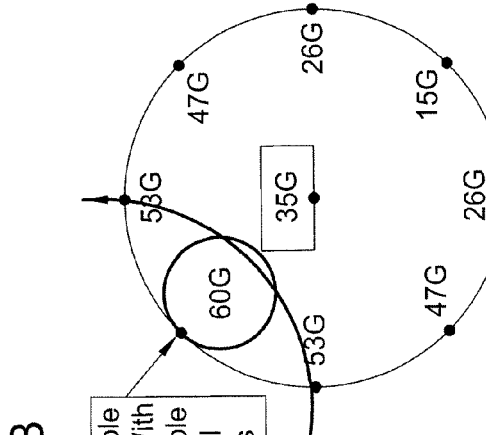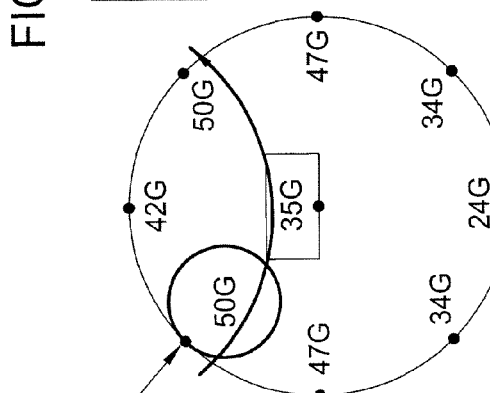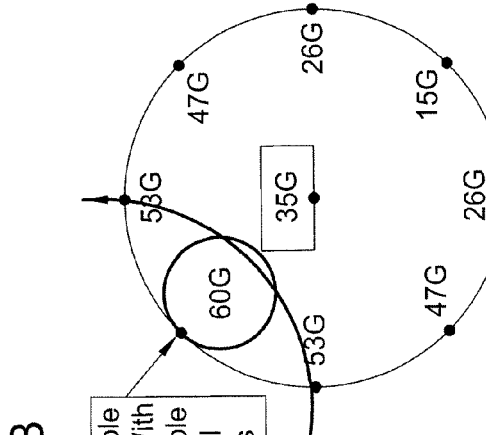

METHOD AND APPARATUS FOR SHAPING A MAGNETIC FIELD IN A MAGNETIC FIELD-ENHANCED PLASMA REACTOR

CROSS-REFERENCE TO RELATED APPLICATIONS

This application is a continuation of U.S. patent application Ser. No. 10/778,933, filed Feb. 3, 2004, by Lindley, et al., now U.S. Pat. No. 7,422,654 and entitled "Method and Apparatus For Shaping A Magnetic Field In A Magnetic Field-Enhanced Plasma Reactor," which application claims the benefit of the filing date of U.S. Provisional Patent Application Ser. No. 60/447,431, filed Feb. 14, 2003, entitled "Method and Apparatus for Producing Plasma Uniformity in a Magnetic Field-Enhanced Plasma Reactor," each of which is incorporated by reference herein.

BACKGROUND OF THE INVENTION

1. Field of the Invention

This invention relates to plasma enhanced, semiconductor substrate processing systems and, more specifically, to a method and apparatus for shaping a magnetic field in a magnetically enhanced plasma reactor.

2. Description of the Related Art

Semiconductor wafer processing chambers commonly employ plasmas to enhance the performance of various processes for fabricating semiconductor devices on silicon substrates or other workpieces. Such processes include sputter etching, plasma enhanced chemical etching, plasma enhanced chemical vapor deposition, and ionized sputter deposition. The high energy level of reagents in the plasma generally increases the rate of the fabrication process, and also reduces the temperature at which the semiconductor workpiece must be maintained to perform the process.

Magnetically enhanced plasma chambers (also referred to as reactors) employ magnetic fields to increase the density of charged particles in the plasma to further increase the rate of the plasma enhanced fabrication process. Increasing the process rate is highly advantageous because the cost of fabricating semiconductor devices is proportional to the time required for fabrication.

Despite this advantage, many plasma chambers in commercial use do not employ magnetic enhancement because the magnetic enhancement has been found to increase the likelihood of damaging the semiconductor devices on the wafer. Such damage is caused by non-uniform electron density across a wafer due to the spatial contour of the magnetic field being poorly optimized.

FIG. 1 depicts a schematic cross section view of a magnetically enhanced plasma chamber 5 suitable for either etching or chemical vapor deposition in accordance with the prior art. FIG. 2 depicts a top cross sectional view of the chamber 5. The vacuum chamber 5 is enclosed by an octagonal sidewall 12, circular bottom wall 14 and circular top wall or lid 16. The lid 16 and bottom wall 14 may be either dielectric or metal. An electrically grounded anode electrode 18 is mounted at the bottom of the lid 16. The anode electrode may be perforated to function as a gas inlet through which process gas enters the chamber. The side wall 12 may be either dielectric or metal. If it is metal, the metal must be nonmagnetic material such as anodized aluminum so as to not interfere with the magnetic field created by an array of electromagnetic coils 6, 7, 8, and 9 located outside the chamber 5. If the side wall is metal, it will function as part of the anode.

The semiconductor wafer or workpiece 20 is mounted on a cathode electrode 22, which, in turn, is mounted in the lower end of the chamber 5. A vacuum pump, not shown, exhausts gases from the chamber 5 through an exhaust manifold 23 and maintains the total gas pressure in the chamber 5 at a level low enough to facilitate creation of a plasma, typically in the range of 10 millitorr to 20 torr, with pressure at the lower and higher end of the range being typical for etching or CVD processes, respectively.

An RF power supply 24 is connected to the cathode pedestal 22 through a series coupling capacitor 26 or matching circuit (not shown). The RF power supply 24 provides an RF voltage between the cathode pedestal 22 and the grounded anode electrode 18 that excites the gases within the chamber into a plasma state. The plasma body has a time average positive DC potential or voltage relative to the cathode or anode electrodes that accelerates ionized process gas constituents to bombard the cathode and anode electrodes.

Magnetic enhancement of the plasma most commonly is implemented by a DC magnetic field in the region between the cathode and anode electrodes. The direction of the magnetic field is usually transverse to the longitudinal axis of the chamber 5, i.e., transverse to the axis extending between the cathode and anode electrodes. Various arrangements of permanent magnets or electromagnets are conventionally used to provide such a transverse magnetic field. One such arrangement is the pair of coils 6, 7 shown in FIG. 1 disposed on opposite sides of the cylindrical chamber side wall 12. FIG. 2 depicts a top, cross-sectional view of the chamber of FIG. 1 that shows the orientation of opposing coil pairs 6, 7, 8 and 9. Generally, the diameter of each coil approximately equals the spacing between the two coils. Each pair of opposing coils 6, 7, 8 and 9 are connected in series and in phase to a DC power supply, not shown, so that they produce transverse magnetic fields which are additive in the region between the coil pairs. This transverse magnetic field is represented in FIGS. 1 and 2 by the vector B oriented along the negative X axis. An example of such a magnetically enhanced plasma chamber is described in commonly assigned U.S. Pat. No. 5,215,619, issued Jun. 1, 1993, which is hereby incorporated by reference in its entirety.

Because the plasma has a positive time average potential or voltage relative to the cathode electrode 22, the time average electric field E in the plasma pre-sheath adjacent the cathode is directed downward from the plasma toward the cathode, thereby giving the free electrons in the pre-sheath a drift velocity vector whose time average values oriented upward towards the plasma body, as represented by vector Ve in FIG. 1. In response to the DC magnetic field vector B, these free electrons will primarily experience a qvxB force, causing the electrons and ions to move in a helical shaped path that generally follows the magnetic field vector. In additional, the electrons and ions will experience another time-averaged force due to the combination of the helical motion and the electric field. This is commonly called the ExB drift, where the direction of the drift is approximately coplanar with the semiconductor wafer 20 and orthogonal to the magnetic field vector B as illustrated in FIG. 2 by the ExB vector oriented along the Y axis.

In this discussion, the term "time average" means averaged over one period of the RF frequency or frequencies at which the plasma is excited, this period typically being less than $10^{-7}$ seconds. This time average over one RF period is unrelated to the time averaging due to the optional rotation of the magnetic field relative to the workpiece that typically has a rotation period on the order of 0.2 to 4 seconds. The frequency of the electron moving helically about the magnetic field vector is f=(qB)/2πm, where q is the electron charge, B is the magnetic field strength (Gauss), and f is the frequency (Hertz). For example, a magnetic field of 35G will result in one turn around the helix lasting about $10e^{-4}$ seconds. This is longer than the RF frequency, but is much shorter than the magnetic field rotation of 0.2 to 4 seconds.

It is believed that the ExB drift of free electrons is a major source of semiconductor device damage in conventional magnetically enhanced plasma chambers. Specifically, it is believed that ExB drift can unevenly distribute the free electrons in the plasma pre-sheath and cause non-uniformity in the ion flux. It is believed that this spatial non-uniformity of the ion flux that bombards the wafer produces electrical currents in the wafer which often damages the semiconductor devices on the wafer.

Conventional magnetically enhanced plasma chambers attempt to ameliorate this non-uniformity by slowly rotating the magnetic field relative to the wafer, typically at a rotation frequency in the range of one quarter to five rotations per second. In some designs, the wafer 20 or the magnets 6, 7, 8 and 9 are physically rotated. In other designs, as illustrated in FIG. 2, the rotation is performed electronically by providing two pairs of coils 6, 7 and 8, 9 that are arranged orthogonally to one another. The magnetic field can be rotated in 90° increments by successively and periodically connecting the DC power supply to the first coil pair 6, 7 with positive polarity (2) to the second coil pair 8, 9 with positive polarity; (3) to the first coil pair 6, 7 with negative polarity; and (4) to the second coil pair 8, 9 with negative polarity. Alternatively, the magnetic field can be rotated continuously by replacing the DC power supply with a very low frequency (in the range of 0.1-10 Hz) power supply having quadrature outputs connected to provide current to the first coil pair 6, 7 offset in phase by 90° from the current provided in the second coil pair 8, 9.

Rotating the magnetic field relative to the wafer greatly reduces the time average spatial non-uniformity in the ion flux bombarding the wafer, and therefore can provide acceptable spatial uniformity of etch rate (in an etching chamber) or deposition rate (in a CVD chamber) on the wafer surface. However, rotating the magnetic field does not in any way improve the instantaneous spatial uniformity of ion flux on the wafer surface, and therefore does not completely solve the problem of semiconductor device damage in magnetically enhanced plasma chambers.

U.S. Pat. No. 6,113,731, issued Sep. 5, 2000, discloses a method and apparatus that further combats the ExB drift problem by driving current through the adjacent coil pairs 6, 9 and 7, 8 such that a magnetic field gradient is generated laterally across the surface of the wafer.

In FIG. 2, the magnetic field produced by driving a first current through coils 7, 8 is represented by arrow 10 and the magnetic field produced by driving a second current through coils 6, 9 is represented by the arrows 11. The first current is less than the second current such that the magnetic field 10 is smaller than magnetic field 11 such that a magnetic field gradient is produced, i.e., the magnetic field is shaped. The ratio of the currents produces the specific shape of the gradient. This ratio is optimized for each process regime to create a nearly uniform plasma. For most process regimens, the current ratio is in the range 0.1 to 0.7. This non-uniform magnetic field produces a more uniform ion flux within the chamber by increasing the magnetic field magnitude in the region of the wafer formerly with low etch rate, and by decreasing the magnetic field magnitude in the region of the wafer formerly with high etch rate. This magnetic field gradient is then adjusted to the shape that optimizes ion flux uniformity for each process condition. The optimum magnetic field gradient is dependent upon the hardware configuration used to produce the magnetic fields. As smaller and smaller feature sizes are used on wafers, the requirements for producing a nearly uniform ion flux continue to become more stringent, especially in certain process regimes, in order to prevent damage to the electrical circuitry formed on the wafer. The optimal gradient may be produced in a static position; however when the current is switched to the next coil pair to cause rotation of the plasma, the plasma "jumps" by 90°. Such a "jump" forms a discontinuity in the plasma process that can damage the substrate or cause non-uniform processing.

Therefore, there is a need in the art for a method and apparatus for controlling the magnetic field gradient within a magnetically enhanced plasma chamber.

SUMMARY OF THE INVENTION

The disadvantages associated with the prior art are overcome by a method and apparatus of providing improved shaping of the magnetic field gradient within a magnetically enhanced plasma reactor to produce a uniform plasma. Generally, the invention uses a plurality of overlapping main magnetic coil sections for forming a magnetic field generally parallel to a top surface of a substrate supporting member. The overlapping magnetic coils produce a magnetic field having a shape that is improved over the prior art. In other embodiments of the invention, sub-magnetic coils are used in conjunction with the main magnetic coils (whether overlapping or not) to provide greater control over the shape of the magnetic field. Such field control can be used to provide an optimal shape to the instantaneous magnetic field as well as a nearly continuous field shape during the transitions as the magnetic field is rotated.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 8A-8C are transitional diagrams depicting the generation of the magnetic field in accordance with the prior art and an embodiment of the invention;

FIGS. 20A and 20B depict current flow through the coil configurations at

FIGS. 19A and 19B;

FIGS. 22A-22K depict magnetic field simulation results for various embodiments of the invention.

DETAILED DESCRIPTION

Figure 3:
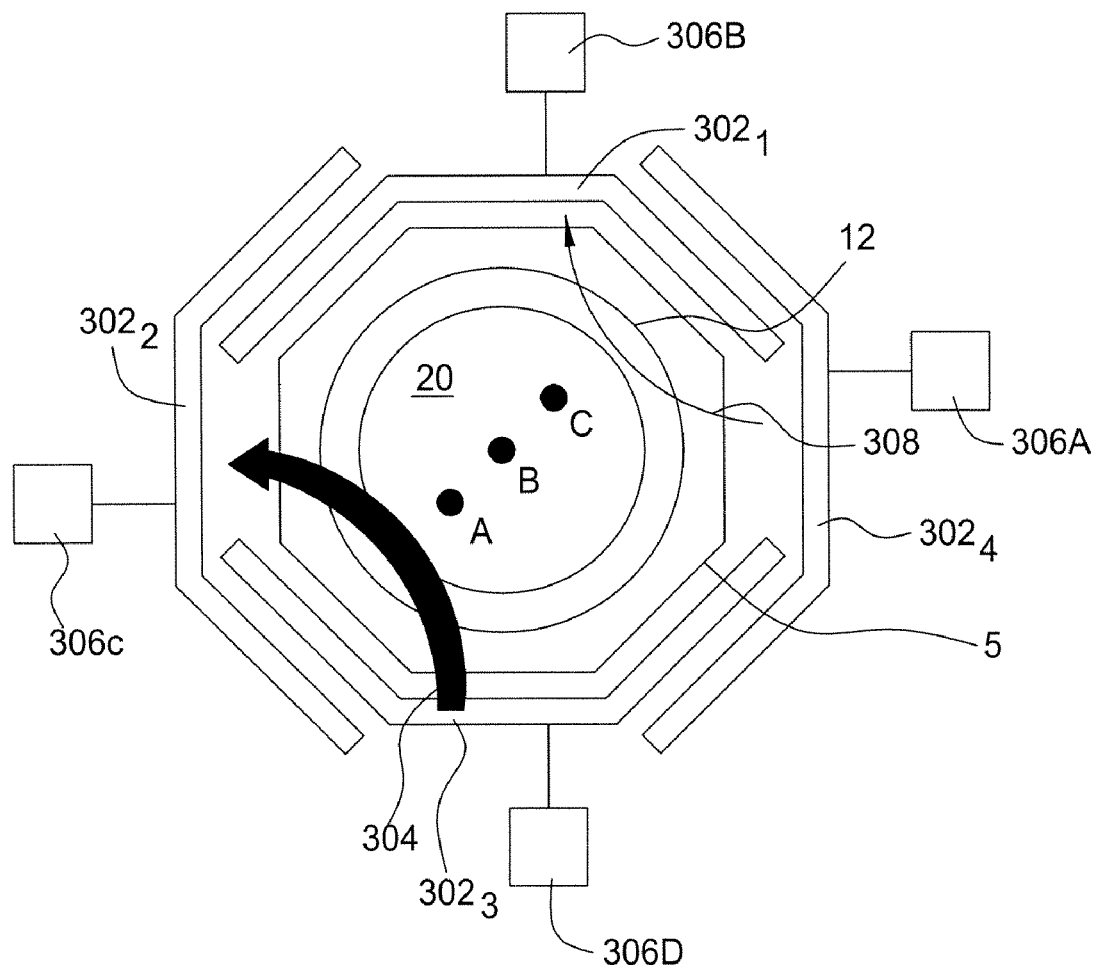
FIG. 3 is a top schematic view of a process chamber having magnetic coils with extended width in accordance with one embodiment of the invention.

FIG. 3 is a top view of an embodiment of a magnetic coil configuration 300 circumscribing sidewall 12 of a plasma enhanced chamber 5 in accordance with the present invention. Specifically, FIG. 3 depicts main magnetic coils $302_1$, $302_2$, $302_3$, and $302_4$ (collectively main magnetic coils 302) and main current sources 306A, 306B, 306C and 306D. As such, in this embodiment of the invention, four coils are driven by four individual currents. Illustratively, the embodiment of the coil configuration 300 is depicted as having a substantially octagonal plan form. However, that depiction is not intended to limit the scope of the invention. For example, a coil configuration in accordance with the invention can be any configuration around the periphery of a chamber 5 with each coil overlapping (or being overlapped by) at least a portion of an adjacent coil.

Illustratively, each of the main magnetic coils 302 has an extended width such that a portion of each coil overlaps (or is overlapped by) an adjacent main magnetic coil 302. Although the main magnetic coils 302 are depicted as having the corners overlapping, that depiction is for illustrative purposes only. The main magnetic coils 302 can overlap more or less than the depiction in FIG. 3. Other embodiments of the invention that utilize overlapping coils are described below in with respect to FIGS. 9-13 and 21.

In the chamber, the magnetic field is generally contoured (or shaped) to combat ExB drift such that, at any given moment, there is a high magnetic field corner and a low magnetic field corner. It is relatively easy to control the magnetic field located in a low magnetic field corner (point C). However, difficulty arises when controlling the field in a high magnetic field corner (point A). FIG. 3 depicts an instantaneous view of a magnetic field produced by driving coils $302_2$ and $302_3$ using relatively high current (arrows 304) and driving coils $302_1$ and $302_4$ using relatively low current (arrow 308). Larger magnetic coils (coils having extended width) allow greater control over the magnitude of the high magnetic field (point A) without affecting the magnetic field strength at points B and C. A larger area encompassed by the magnetic coils 302 provides an improved magnetic field gradient. However, the size of the main magnetic coils 302 is limited by the size of the reaction chamber. For example, due to the size of the reaction chamber and placement of its supporting hardware, generally the magnets can't generally be made taller. However, the magnets can be made wider to increase the coil area. As such, making the magnets wider produces larger coil areas to facilitate improved magnetic field shape e.g., the coils 302 of FIG. 3 extend more than 90° about the circumference of the chamber 5. FIGS. 9-21D (described in greater detail below) depict illustrative embodiments that allow greater control over the shape of the magnetic field.

The main current sources 306A-D drives current through each of the main magnetic coils 302. To generate the magnetic field, the main current sources 306A and 306B apply current to adjacent main magnetic coils $302_1$ and $302_2$ in the same direction. To produce an effective magnetic field gradient in the chamber, the current sources 306C and 306D apply current to flow in main magnetic coils $302_3$ and $302_4$. Further, the opposing magnetic field 308 generated by main magnetic coils $302_3$ and $302_4$ is of a lesser magnitude than the magnetic field generated by main magnetic coils $302_1$ and $302_2$. Illustratively, four current sources are depicted as causing current to flow through each of the main magnetic coils 302. As coil pairs are driven to produce a magnetic field in a reactor having a configurable magnetic field ("CMF"), the B-field is high nearest the adjacent coils, i.e., the field strength is highest in the corner at point A, and decreases across the wafer to point C. The currents are then switched from coil pair to coil pair to rotate the magnetic field. Such a reactor that uses a CMF technique is the eMxP+ Dielectric Etch reactor manufactured by Applied Material, Inc. of Santa Clara, Calif. This reactor is the subject of U.S. Pat. No. 6,113,731, issued Sep. 5, 2000, which is incorporated herein by reference.

Figure 4A:
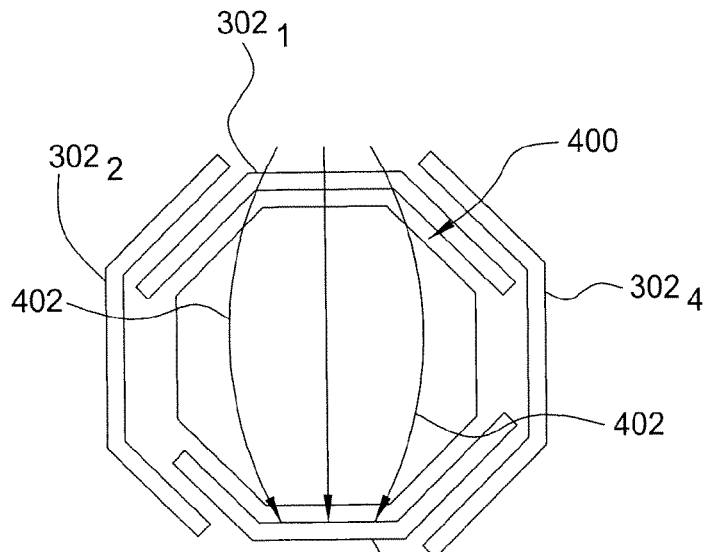
FIG. 4A-C depict a top schematic view of the magnetic fields respectively produced by main coils, sub-magnetic coils and both main and sub-magnetic coils.
Figure 4B:
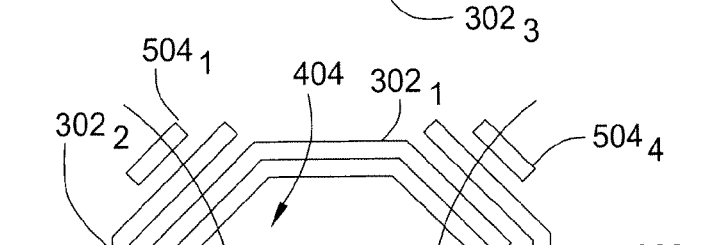
Figure 4C:
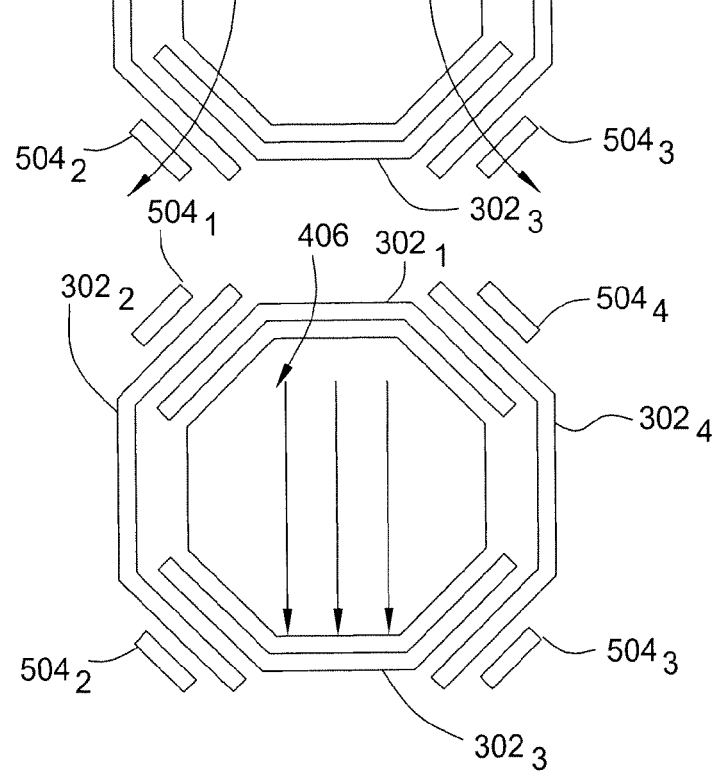

In some processes, opposite coils (e.g., $302_1$ and $302_3$) are driven with current in pairs to produce magnetic fields that extend across the substrate. For best process results, it is desired that the magnetic field uniformly extend across the chamber with parallel lines of force. However, as depicted in FIG. 4A, when coils $302_1$ and $302_3$ are driven, the magnetic field 400 has a convex shape, i.e., the outer lines of force 402 curve outward. To mitigate this convex field shape, a corrective magnetic field can be provided that has a concave shape. FIG. 4B depicts such a concave-shaped corrective field 404 being produced by sub-magnetic coils $504_1$, $504_2$, $504_3$ and $504_4$ that are positioned proximate the main magnetic coils $302_1$, $302_2$, $302_3$ and $302_4$. As is discussed in detail below, the sub-magnetic coils are positioned proximate the ends of the main magnetic coils. As depicted in FIG. 4C, the vector addition of the main and corrective fields forms a uniform field 406 extending across the chamber. As is discussed below, the addition of such sub-magnetic coils $504_1$, $504_2$, $504_3$ and $504_4$ provide a large number of other benefits including additional magnetic field shape control for both instantaneous fields and for controlling the field shape as the fields are switched to facilitate field rotation.

The use of corrective fields can be extended to be produced by a wide variety of coil configurations. These configurations include placing coils that generate corrective fields in a horizontal plane about the chamber, a vertical plane about the chamber, or both. A limited sample of the possible embodiments of the invention that utilize such corrective fields are discussed below. The invention is intended to encompass any combination of coils that provide corrective magnetic fields for shaping the magnetic field produced by the main coils.

Figure 5:
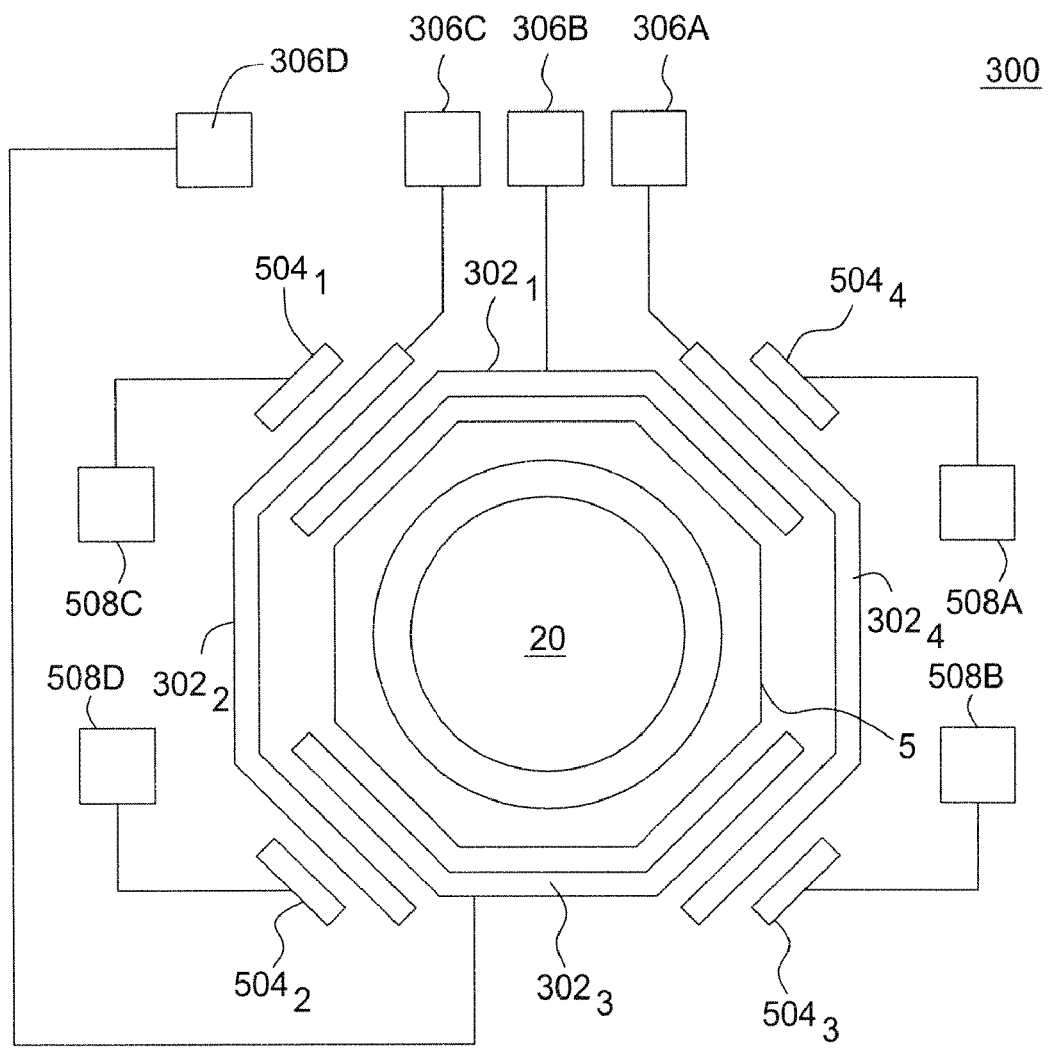
FIG. 5 is a top schematic view of a process chamber having both extended width main magnetic coils and sub-magnetic coils in accordance with one embodiment of the invention.

As depicted in FIG. 5, for greater control over the shape of the magnetic field in the chamber, sub-magnetic coils $504_1$, $504_2$, $504_3$, $504_4$ (collectively referred to as sub-magnetic coils 504) are strategically placed proximate the main magnetic coils 302. Illustratively, the sub-magnetic coils 504 are placed proximate the overlapping portions of the main magnetic coils 302. The sub-magnetic coils 504 generate a magnetic field and allow "tuning" of the fields produced in the corners (i.e., the overlapping portions). The sub-magnetic coils 504 are used to control the shape of the magnetic field.

The overall field contour can be established by varying the turns, angle, width, and separate current drives. The angle and width of the coils allow the placement of more coils (i.e., a stronger magnetic influence) in the reactor. More turns in a coil also provide a stronger magnet. A stronger magnet produces a stronger magnetic field and provides greater control over the magnetic field gradient. Although it is convenient to place the sub-coil in the overlapping portions—it is not mandatory. In other embodiments of the invention, the sub-magnetic coils can be placed adjacent (i.e., end to end) to the main magnetic coils (See FIGS. 16 and 17 below). As shall be discussed in detail below, when sub-magnetic coils are used, the main coils establish an initial shape of the magnetic field and the sub-magnetic coils can then be used to adjust (or correct) the field contour to achieve an optimal magnetic field shape.

To achieve a desired magnetic field contour, current is driven through each of the sub-magnetic coils 504. Specifically, current sources 308A and 308B drives current through sub-magnetic coils $504_1$ and $504_2$, and current sources 308C and 308D drives current through sub-magnetic coils $504_3$ and $504_4$. In one embodiment, each of the sub-magnetic coils 504 can be driven by separate current sources such that up to eight current sources can be used to drive the main and sub-magnetic coils. Such independent current facilitate wide control over the magnetic field shape. In one embodiment of the invention, four current sources can be used to provide current to the main magnetic coils 302 and sub-magnetic coils 504. In the instance when four current sources are used, the sub-magnetic coils are "double wound" with each of the two windings series connected to a different adjacent main magnetic coil. This configuration uses the same number of currents as are used in an existing eMxP$^+$ chamber identified above.

Figure 6:
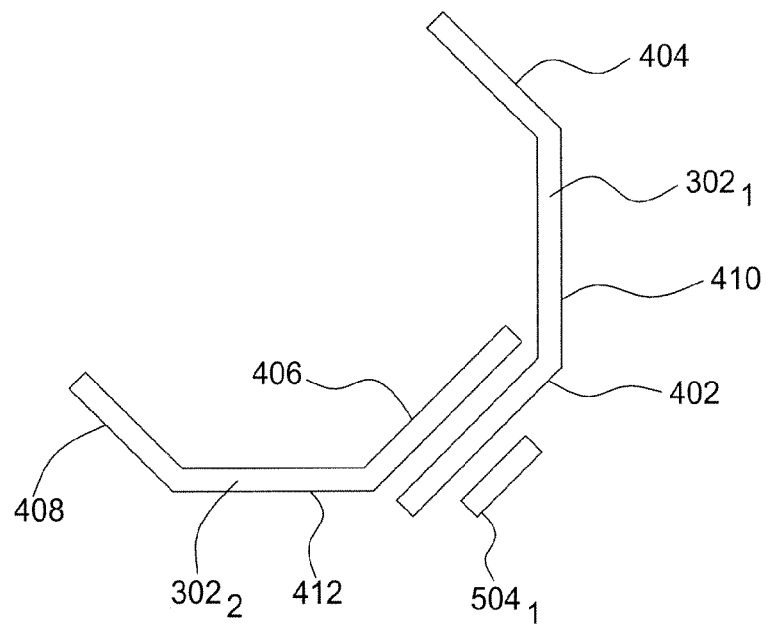
FIG. 6 is a top view of two main magnetic coils and a sub-magnetic coil section shown in FIG. 5.

FIG. 6 is a top view of two main magnetic coils 302 (i.e., main magnetic coils $302_1$ and $302_2$,) and sub-magnetic coil $504_1$. Main magnetic coil $302_1$ has a central portion 410 and overlapping portions 402 and 404. Main magnetic coil $302_2$ has a central portion 412 and overlapping portions 406 and 408. Although the sub-magnetic coil $504_1$ is depicted as being positioned outside the periphery of the main magnetic coils 302 that depiction is for illustrative purposes only. In the embodiment depicted in FIGS. 6 and 7 the sub-magnetic coils 504 are located between the overlapping portions and within the plane of the overlapping portions.

Figure 7:
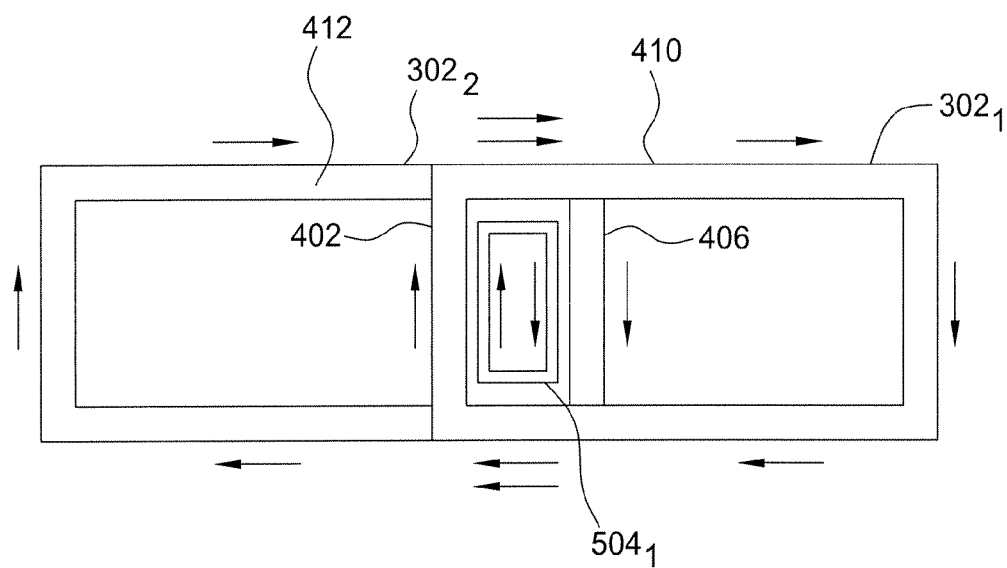
FIG. 7 is a side view of main magnetic coil sections and the sub-magnetic coil shown in FIG. 6.
Figure 7A:
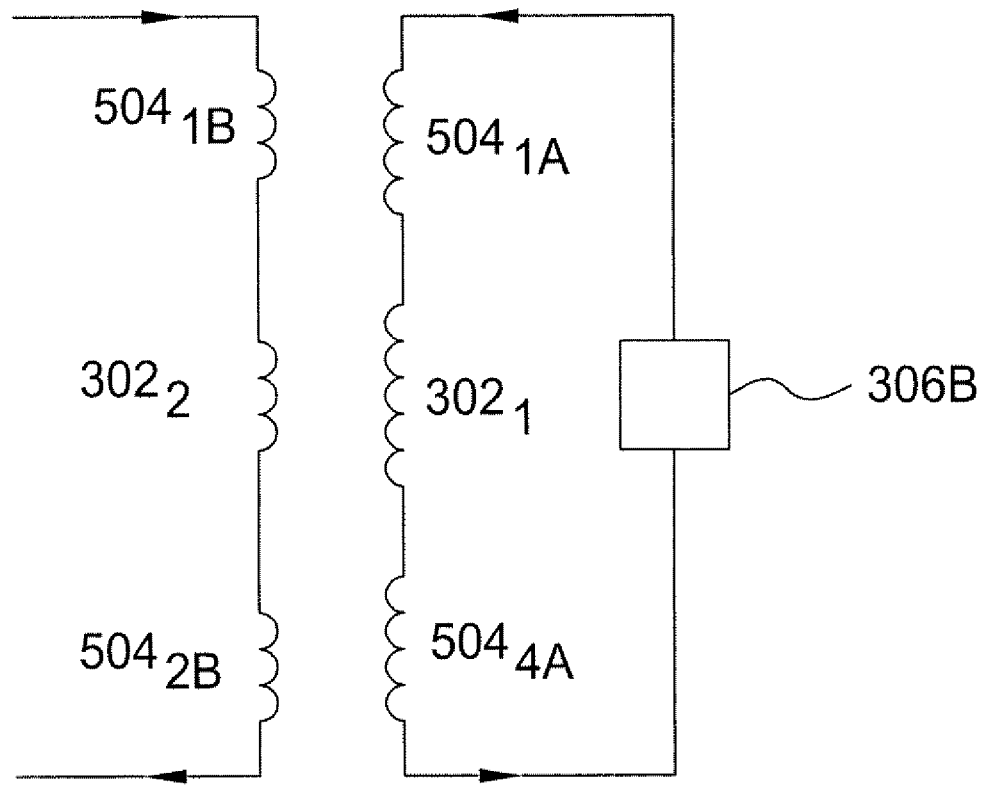
FIG. 7A depicts a schematic circuit of a double wound version of the coil configuration of FIG. 7.

FIG. 7 is a side view of main magnetic coils 302 (i.e., main magnetic coils $302_1$ and $302_2$,) and sub-magnetic coil $504_1$. FIG. 7A depicts a schematic circuit of a double wound version of the coil configuration of FIG. 7. The sub-magnetic coil $504_1$ is wound as two coils $504_{1A}$ and $504_{1B}$ onto a single "bobbin" and each coil $504_{1A}$ and $504_{1B}$ is respectively series connected to a main coil $302_1$ and $302_2$. Additionally, the sub-magnetic coil $504_{4A}$ is wired in series with the main coil $302_1$ and sub-magnetic coil $504_{1A}$. Thus, four current sources 306A, 306B, 306C and 306D drive current through each of the four sets of three coils. As such, each current is driven through three series connected coils, i.e., two sub-magnetic coils and a main coil. Each main and sub-magnetic coil is wound and wired in this manner to enable four current sources to shape and control the magnetic field within the chamber. During the etching process, adjacent magnetic coils generate a relatively strong magnetic field at predetermined intervals. The current through adjacent magnetic coils can flow in the same direction as shown by the arrows. Specifically, FIGS. 7 and 7A depict the direction of the flow of current through main magnetic coils $302_1$ and $302_2$, and sub-magnetic coils $504_1$. Note that the current through main magnetic coils $302_1$ and $302_2$, and sub-magnetic coils $504_1$ flows in a clockwise direction. As such, the current is additive and creates a larger magnetic field than if the currents flow in opposite directions.

FIGS. 8A-8C together depict transition sequences used to rotate the magnetic field in an etching chamber. FIG. 8A depicts the prior art application of different magnetic field intensities for magnetic coils at intervals (or degrees with respect to an initial starting point) 602, 604, and 606. For example, FIG. 8A comprises magnetic coils 6, 7, 8, and 9 of the prior art; a high magnetic field 620; and a low magnetic field 622. At interval 602 (zero degrees), adjacent magnetic coils 8 and 9 generate a curved high magnetic field 620. During this same interval, magnetic coils 6 and 7 generate a curved low magnetic field 622. When combined, the two curved magnetic fields 620 and 622 form a concave shaped field above the substrate in the chamber. During transition from one pair of adjacent coils to another pair of adjacent coils that facilitates field rotation, the plasma in the etching chamber momentarily jumps as the field is rotated. To provide a smoother field, at interval 604 (forty-five degrees), a high magnetic field 624 is generated between coils 6 and 8 by applying current to coils 6 and 8 only. This generation of the high convex magnetic field 624 at forty-five degrees helps lessen the jump in the plasma. At interval 606 (ninety degrees), the curved high magnetic field 626 is generated by magnetic coils 6 and 9, while the low magnetic field 628 is generated by magnetic coils 7 and 8. At this point, rotation is complete. However, the magnetic field gradient at interval 604 is substantially different from the gradient in intervals 602 and 606.

FIG. 8B depicts the transition of the high magnetic field at intervals 614, 616, and 618 (zero, forty-five, and ninety degrees respectively) while maintaining the current magnetic field gradient in accordance with the present invention. For example, FIG. 8B comprises main magnetic coils $302_1$, $302_2$, $302_3$ and $302_4$; sub-magnetic coils 504, $504_2$, $504_3$, and $504_4$; a high magnetic field 630; and a low magnetic field 632. At interval 614, the curved high magnetic field 630 is generated at main magnetic coils $302_1$ and $302_2$ while the curved low magnetic field 632 is generated by main magnetic coils $302_3$ and $302_4$. Interval 616 provides a smoother transition from zero to ninety degrees because the magnetic field gradient is maintained at the 45° position. Specifically, current is applied to sub-magnetic coils $504_4$ and $504_1$ which generates a high magnetic field 634. In addition, a low magnetic field 636 is generated by sub-magnetic coils $504_2$ and $504_3$. Note that at interval 616 (forty five degrees) that the magnetic fields generated are curved such that they have the same shape and gradient as the fields at zero degrees. A consistent, individual curved magnetic field within the etching chamber provides a consistent magnetic field gradient within the chamber. At interval 618 (90°), current is applied to main magnetic coils $302_1$ and $302_4$ which generates a high magnetic field 638. In addition, a low magnetic field 640 is generated by the application of current to main magnetic coils $302_2$ and $302_3$.

FIG. 8C depicts using various combinations of coils to achieve a substantially smooth rotation of the magnetic field during a 90° rotation in accordance with another embodiment of the invention. The currents are indicated as normalized values relative to the high magnetic field coil current and the direction of the current is indicated by a plus or minus. For example, at time to, a magnetic field "BCD" is generated by adjacent magnetic coils $302_2$ and $302_3$ (i.e., the polarity of magnetic coil $302_3$ is opposite to the polarity of magnetic coil $302_2$). Current also passes through sub-magnetic coils $504_1$ and $504_3$ to provide a magnetic field "A" that helps shape the magnetic field at the ends of the adjacent magnetic coils $302_2$ and $302_3$. Note that the polarity of the current in sub-magnetic coil $504_1$ is opposite to the polarity of the current in sub-magnetic coil $504_3$.

At t1, current is applied to the respective coils 302 and 504 such that a diminished magnetic field "CD" is generated by adjacent magnetic coils $302_2$ and $302_3$. The numbers and respective polarities depicted represent relative (normalized) magnitude and polarity of the applied currents. For example, the current that passes through magnetic coil $302_1$ has a polarity opposite to sub-magnetic coil $504_3$. As such, the portion of the magnetic field represented by "A" is transitioned between $504_3$ and $302_1$. The sub-magnetic coil $504_1$ causes the portion of the magnetic field represented by "B" to be generated at sub-magnetic coil $504_1$ and main magnetic coil $302_3$. The transitioning process is performed by increasing and decreasing the current between main magnetic coils 302 and sub-magnetic coils 504.

At t2, current is applied to the sub-magnetic coils $504_1$ and $504_2$ and the current is increased at main magnetic coil $302_1$. As a result, the magnetic field represented by "B" moves vertically between main magnetic coils $302_1$ and $302_3$. The portion of the magnetic field represented by "C" transitions towards sub-magnetic coil $504_1$.

At t3, no current is applied to main magnetic coil $302_2$, and there is an increase in the current applied to main magnetic coil $302_1$. As a result, the portion of the magnetic field represented by "C" flows vertically between main magnetic coils $302_1$ and $302_3$.

At t4, the current at main magnetic coil $302_2$ is turned on and the current at $302_3$ is decreased. As a result, the portion of the magnetic field represented by "D" flows between main magnetic coil $302_2$ and sub-magnetic coil $504_1$.

At t5, the current at sub-magnetic coil $504_3$ is turned off, the current at main magnetic coil $302_3$ is decreased, and the current at main magnetic coil $302_2$ is increased. As a result, the portions of the magnetic fields represented by "A," "B," "C," and "D" flow between the coils as shown.

Lastly, at t6, the current is increased at main magnetic coil $302_2$ and turned off at main magnetic coil $302_3$. As a result, the magnetic field gradient represented by "A" flows between sub-magnetic coils $504_2$ and $504_4$ and the magnetic field represented by "BCD" flows between main magnetic coils $302_1$ and $302_2$, i.e., the magnetic field has been rotated by 90° while maintaining a gradient during the transition.

FIG. 8C should be considered one example of using the invention to rotate the magnetic field. Other current combinations may produce useful magnetic field rotation.

Figure 9:
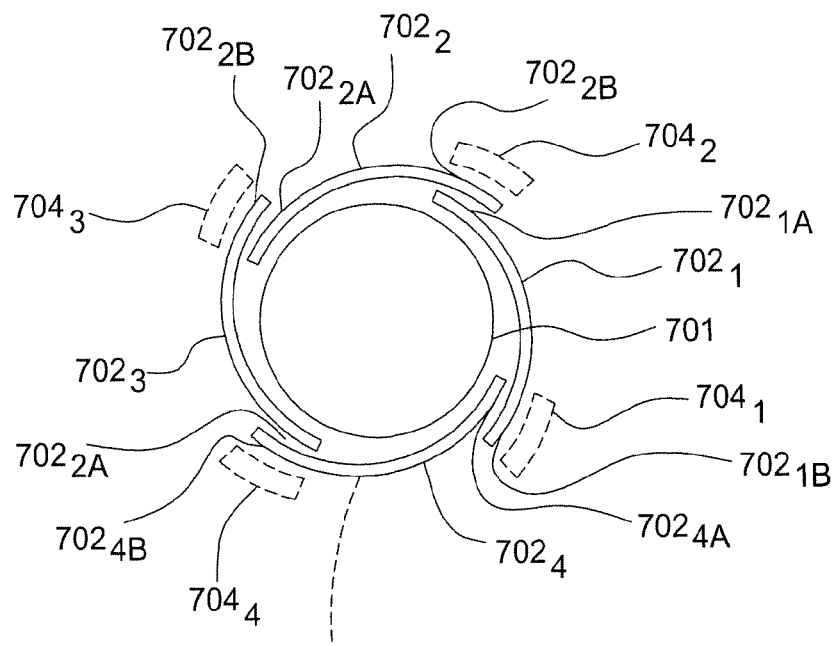
FIGS. 9-17 are top views of various embodiments of magnetic coil configurations in accordance with the invention.

FIG. 9 depicts a top view of an alternative embodiment of a magnetic coil configuration 700 circumscribing a cylindrical process chamber 701. This configuration is similar to that shown in FIGS. 3 and 5 above, except the main coils are interleaved, i.e., for each coil, one end is overlapped and one end is overlapping. The magnetic coil configuration 700 comprises overlapping main magnetic coils $702_1$, $702_2$, $702_3$, and $702_4$ (collectively main magnetic coil 702) and optional sub-magnetic coil $704_1$, $704_2$, $704_3$, and $704_4$ (collectively main magnetic coil 704). Each of the main magnetic coils 702 has one end $702_{XB}$ that overlaps an end (where X is the coil number) of an adjacent magnetic coil and the other end $702_{XA}$ of the main magnetic coil $702_X$ is overlapped by an end of another adjacent main magnetic coil 702. For example, the end $702_{1B}$ overlaps the end $702_{4A}$ and the end $702_{1A}$ is overlapped by the end $702_{2B}$. Note that each of the main magnetic coils 702 is positioned such that the ends of any of the main magnetic coils 702 is not equidistant from a center of the process chamber 701. Because the coils are positioned on a slight angle, the magnetic coils can be made larger (wider) than if they were arranged on a common cylinder. In addition, sub-magnetic coil 704 can be placed proximate the overlapping portions of the main magnetic coils 702 to provide greater magnetic field control as described above with respect to FIGS. 8B and 8C. The sub-magnetic coils 704 can be positioned in the plane of the main coils (as discussed with respect to FIG. 7) or outside the main coils. It is appreciated that other embodiments may be used in accordance with the invention that utilizes main magnetic coils having a larger or smaller angle than the angle of the main magnetic coils 702 depicted in coil configuration 700.

Figure 9A:
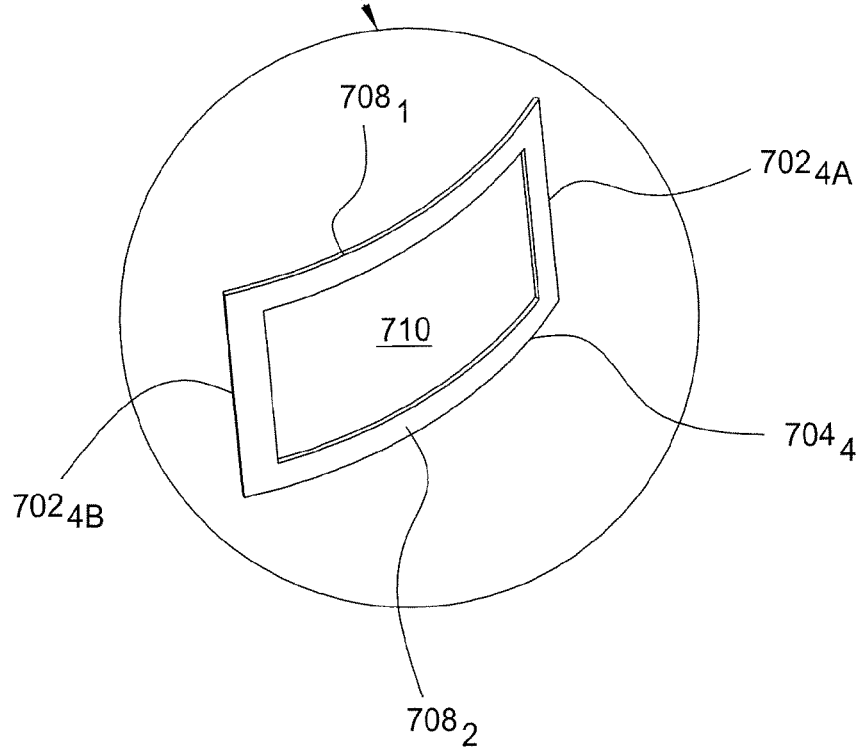

FIG. 9A depicts a perspective view of one main magnetic coil (coil $702_4$) in FIG. 9. The main magnetic coil $702_4$ contains ends $702_{4A}$ and $702_{4B}$, a top portion $708_1$, a bottom portion $708_2$, and an interior area 710. The top portion $708_1$ and bottom portion $708_2$ are curved and substantially parallel to each other. The top portion $708_1$ and bottom portion $708_2$ are connected via ends $702_{4A}$ and $702_{4B}$. The ends $702_{4A}$ and $702_{4B}$ are substantially parallel to each other. The main magnetic coil $702_4$ contains an interior area 710 formed by the interconnection of the ends $702_{4A}$ and $702_{4B}$, the top portion $708_1$, and bottom portion $708_2$.

Figure 10:
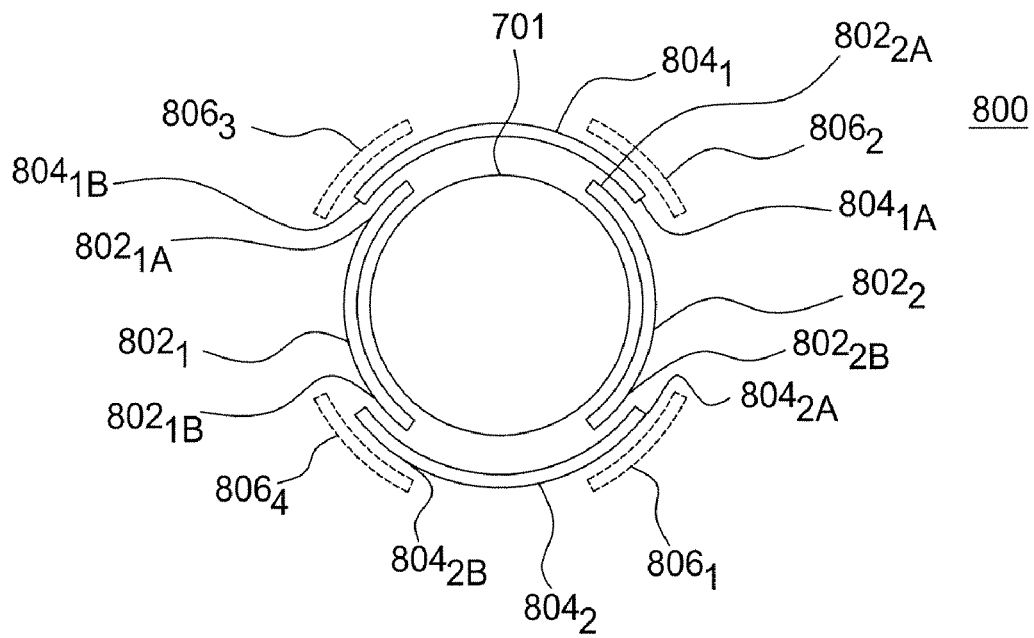

FIG. 10 depicts a top view of another embodiment of a magnetic coil configuration 800 circumscribing a cylindrical process chamber 701. This configuration is the same as FIGS. 3 and 5 except the chamber 701 is now cylindrical rather than octagonal. The magnetic coil configuration 800 contains main magnetic coils $802_1$, and $802_2$, (collectively main magnetic coil 802), main magnetic coil $804_1$ and $804_2$ (collectively main magnetic coils 804), and optional sub-magnetic coils $806_1$, $806_2$, $806_3$ and $806_4$ (collectively sub-magnetic magnetic coils 806). Main magnetic coils 802 are positioned opposite each other and slightly curved towards one another to partially circumscribe the process chamber 701. Each main magnetic coil 802 covers about 90° of the circumference of the chamber 701. Main Magnetic coils 804 are positioned outside of main magnetic coils 802 and are offset by about 90° from the main magnetic coils 802. Each of the main magnetic coils 802, 804 has two ends. Specifically, main magnetic coils $802_X$ (where X is the coil number) have ends $802_{XA}$ and $802_{XB}$, and main magnetic coils $804_X$ have $804_{XA}$ and $804_{XB}$. The main magnetic coils 804 are positioned opposite of each other and slightly curved towards one another to partially circumscribe the process chamber 701. In addition, main magnetic coil 804 overlap ends of main magnetic coils 802. For example, main magnetic ends $802_{1A}$ and $802_{2B}$ are overlapped by ends $804_{1B}$ and $804_{1A}$ respectively. Further, sub-magnetic coils 806 can be positioned in or near the overlapping portions of the main magnetic coils 802 and 804 or outside the main magnetic coils 802 and 804.

Figure 11:
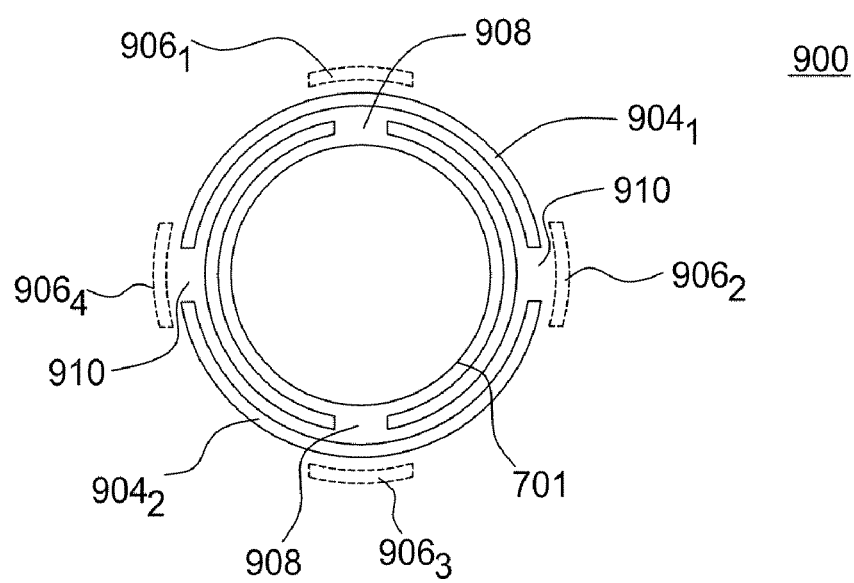

FIG. 11 depicts another embodiment of magnetic coil configuration 900 circumscribing a cylindrical process chamber 701. This configuration is similar to FIG. 10 except each of the main coils cover about 180° of the chamber circumference and the sub-magnetic coils are centrically aligned with the main coils. The magnetic coil configuration 900 contains main magnetic coils $902_1$ and $902_2$, (collectively main magnetic coils 902), main magnetic coils $904_1$ and $904_2$ (collectively main magnetic coils 904), and optional sub-magnetic coils $906_1$, $906_2$, $906_3$, and $906_4$ (collectively sub-magnetic magnetic coils 906). Main magnetic coils $902_1$ and $902_2$, are positioned opposite each other and curved towards each other to circumscribe the process chamber 701. Spaces 908 are formed between adjacent ends of the main magnetic coils 902. Further each main magnetic coil 902 covers about 180° of the circumference of the process chamber 701. Main magnetic coils $904_1$, and $904_2$, are positioned outside of main magnetic coils 902, are curved inwards, and are positioned opposite of each other. Spaces 910 are formed between adjacent ends of the main magnetic coils 904. Further the main magnetic coils 904 are offset from the main magnetic coils 902 by about 90°. Each of the main magnetic coils 904 covers about 180° of the circumference of the process chamber 701. The coil configuration 900 is similar to the coil configuration 800 except that in the coil configuration 900 the main magnetic coils overlap more than in the coil configuration 800. Further, the optional sub-magnetic coils 906 are juxtaposed to the spaces 908 and 910 of the main magnetic coils 902 and 904, respectively. In this configuration, the centers of the sub-magnetic coils 906 are aligned with the centers of the respective main magnetic coils 902 and 904. Generally, the 180 degree main magnetic coils 902 and 904 are not very effective in producing magnetic field gradients. The addition of the sub-magnetic coils 906 improves the ability of the coil configuration to produce magnetic field gradients. If the coils are driven by eight independent currents, the configuration provides substantial control of the magnetic field shape. Alternatively, the configuration may also be operated using four currents by wiring in series the following coil pairs: $904_1$ and $906_1$; $902_1$ and $906_2$; $904_2$ and $906_3$ and $902_2$ and $906_4$.

Figure 12:
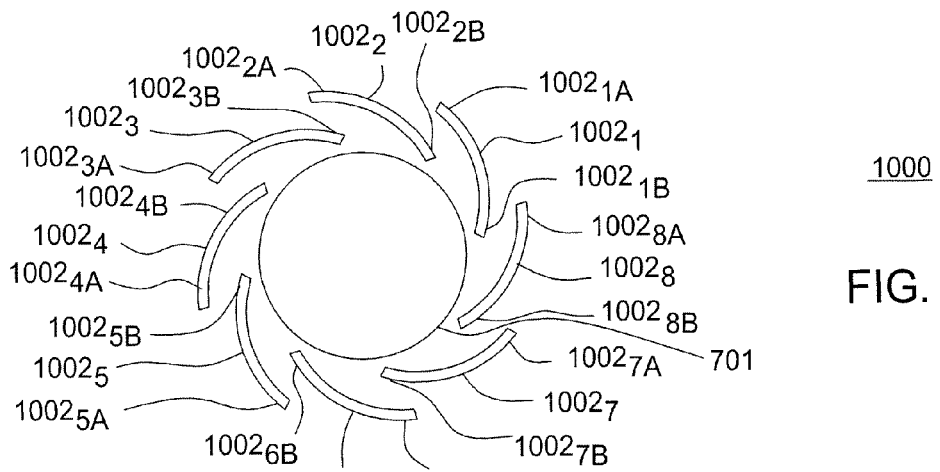

FIG. 12 depicts another embodiment of a top view of a magnetic coil configuration 1000 to circumscribe a process chamber 701. Magnetic coil configuration 1000 contains main magnetic coils $1002_1$-$1002_8$, (collectively main magnetic coils 1002). Each of the main magnetic coils 1002 is curved. Each of the main magnetic coils 1002 has one end $1002_{XA}$ that overlaps an adjacent magnetic coil $1002_Y$ (where X is the coil number) and one end $1002_{XB}$ that is overlapped by another adjacent magnetic coil $1002_Y$. In addition, each of the main magnetic coils 1002 covers about 45° to circumscribe the process chamber 701. Although FIG. 12 depicts the magnetic coil configuration 1000 as having eight coils other embodiments can be used (e.g., sixteen magnetic coils). In an embodiment that uses sixteen coils, each of the coils covers about 22.5° to circumscribe the process chamber 701. In general, any number of overlapping coils may be used. Note that the use of N coils (where N is an integer greater than 1, where each coil has a width that covers greater than 360/N degrees, then the shape of the magnetic field in the chamber is improved over a coil configuration having N coils that do not overlap, i.e., wider coils improve the magnetic field shape.

Figure 13:
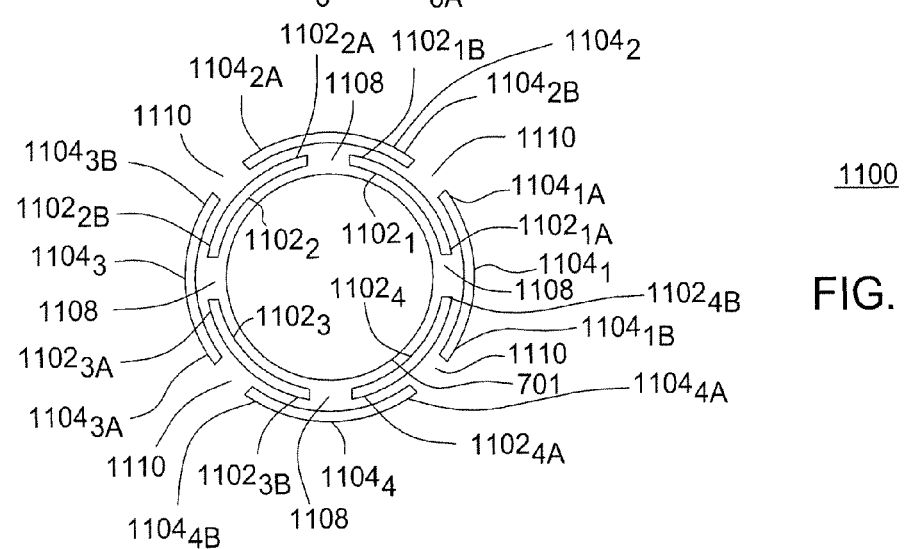

FIG. 13 depicts a top view of another embodiment of a magnetic coil configuration 1100 to circumscribe a process chamber 701. The coil configuration 1100 contains main magnetic coils $1102_1$, $1102_2$, $1102_3$, and $1102_4$ (collectively main magnetic coils 1102), and main magnetic coils $1104_1$, $1104_2$, $1104_3$, and $1104_4$ (collectively main magnetic coils 1104). Each of the main magnetic coils 1102 covers about 90° to circumscribe a process chamber 701 and has an adjacent main magnetic coil 1102. There is a space 1108 formed between each adjacent main magnetic coil 1102. Main magnetic coils $1104_X$ are curved and placed outside of main magnetic coils $1102_X$ such that each end of the main magnetic coil 1104 overlaps an end of two adjacent main magnetic coils 1102 (where X is the coil number). For example, main magnetic coil ends $1104_{2A}$ and $1104_{2B}$ overlap main magnetic coil ends $1102_{2A}$ and $1102_{1B}$, respectively. Each main magnetic coil 1104 covers about 90° to circumscribe a process chamber 701. There is a space 1110 formed between adjacent main magnetic coils 1104. In addition, main magnetic coils 1104 are offset from main magnetic coils 1102 by about 90°.

Figure 14:
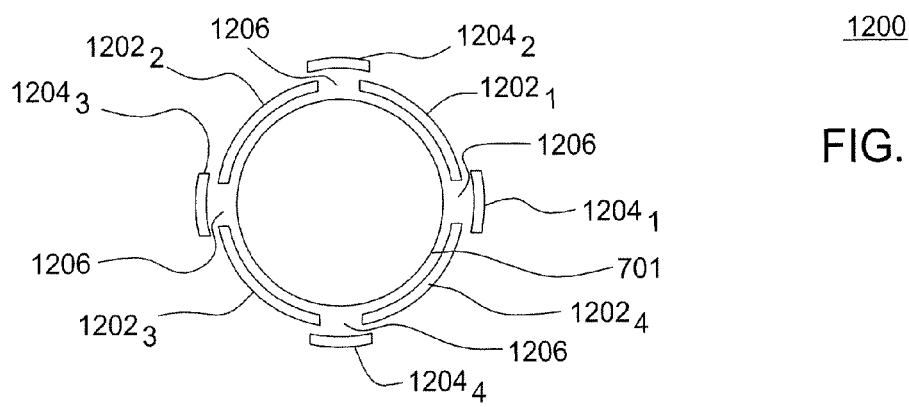

FIG. 14 depicts a top view of another embodiment of a magnetic coil configuration 1200 to circumscribe a process chamber 701. This configuration is similar to the configuration of FIGS. 3 and 5 except the main coils do not overlap. The magnetic coil configuration 1200 contains main magnetic coils $1202_1$, $1202_2$, $1202_3$, and $1202_4$ (collectively main magnetic coils 1202) and sub-magnetic coils $1204_1$, $1204_2$, $1204_3$, and $1204_4$ (collectively sub-magnetic coils 1204). Each main magnetic coil 1202 is curved inwards to circumscribe the process chamber 701 and covers about 90° of the circumference of the process chamber 701. Each main magnetic coil 1202 is adjacent to two other main magnetic coils 1202. The adjacent main magnetic coils 1202 are positioned end to end such that there is a space 1206 between adjacent ends of each of the main magnetic coils 1202.

Sub-magnetic coils 1204 are positioned adjacent to the spaces 1206 formed between adjacent main magnetic coils 1202. The sub-magnetic coils have centers that are positioned 45 degrees offset from the centers of the main magnetic coils. The sub-magnetic coils 1204 improve the shape of the magnetic fields generated within the chamber. If the coils are driven with eight independent currents, the configuration provides substantially improved control over the shape of the magnetic field produced in the chamber. Illustratively, the sub-magnetic coils 1204 are depicted as being located on the outer periphery of the main magnetic coils 1204.

In operation, a magnetic field gradient can be produced in the chamber by energizing three coil pairs, e.g., high current to coils $1202_2$ and $1202_3$, medium current to coils $1204_2$ and $1204_4$, and low current to coils $1202_1$ and $1202_4$. The pairs of main magnetic coils form a concave magnetic field and the pair of sub-magnetic coils forms a convex magnetic field. The vector addition of these fields produces a field with improved parallel lines of force across the substrate.

Figure 15:
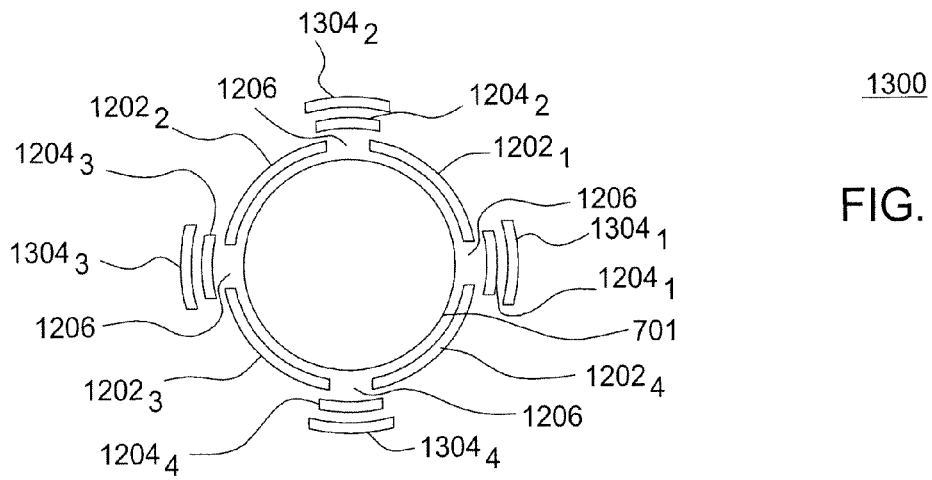

FIG. 15 depicts a top view of another embodiment of a magnetic coil configuration 1300 to circumscribe a process chamber 701. The magnetic coil configuration 1300 contains main magnetic coils $1202_1$, $1202_2$, $1202_3$, and $1202_4$ (collectively main magnetic coils 1202); sub-magnetic coils $1204_1$, $1204_2$, $1204_3$, and $1204_4$ (collectively sub-magnetic coils 1204); and sub-magnetic coils $1304_1$, $1304_2$, $1304_3$, and $1304_4$ (collectively sub-magnetic coils 1304). Each main magnetic coil 1202 is curved inwards to circumscribe the process chamber 701 and covers about 90° of the circumference of the process chamber 701. Each main magnetic coil 1202 is adjacent to two other main magnetic coils 1202. The adjacent main magnetic coils 1202 are positioned end to end such that there is a space 1206 between adjacent ends of each of the main magnetic coils 1202. The sub-magnetic coils 1304 are juxtaposed to the sub-magnetic coils 1204. The sub-magnetic coils 1304 increases the number of coil winding positioned near the spaces 1206 between main magnetic coils 1204. The addition of sub-magnetic coils 1304 provides a magnetic field additive to the magnetic field generated by main magnetic coils 1202 and sub-magnetic coils 1204. In this embodiment, twelve currents can be applied to achieve substantial improvement in the control of the magnetic field shape. Alternatively, the sub-magnetic coils can be wired in series with the adjacent main coils as described with respect to FIG. 7A such that only four current supplies are used to drive the configuration.

Figure 16:
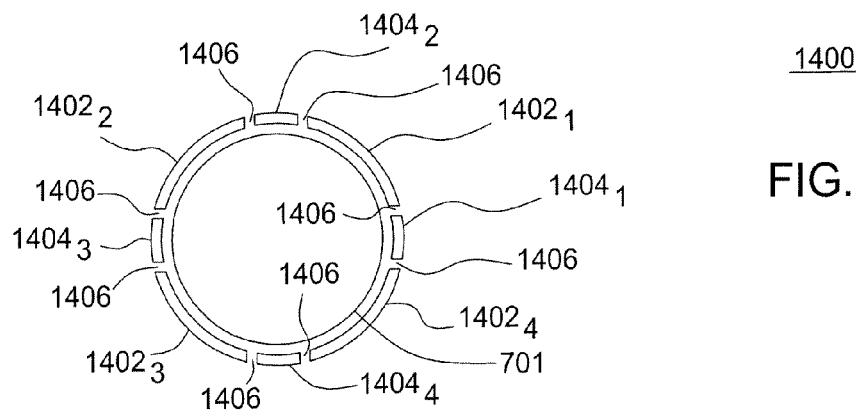

FIG. 16 depicts a top view of another embodiment of a magnetic coil configuration 1400 to circumscribe a process chamber 701. The magnetic coil configuration 1400 contains main magnetic coils $1402_1$, $1402_2$, $1402_3$, and $1402_4$ (collectively main magnetic coils 1402); and sub-magnetic coils $1404_1$, $1404_2$, $1404_3$, and $1404_4$ (collectively sub-magnetic coils 1404). Each of the main magnetic coils 1402 and sub-magnetic coils 1404 is curved, in the same plane, and alternatively positioned end to end. A space 1406 is formed between each alternatively positioned main magnetic coil 1402 and sub-magnetic coil 1404. The area covered by a main magnetic coil 1402 and a sub-magnetic coil 1404 is about 90° of the circumference of the process chamber 701.

Figure 17:
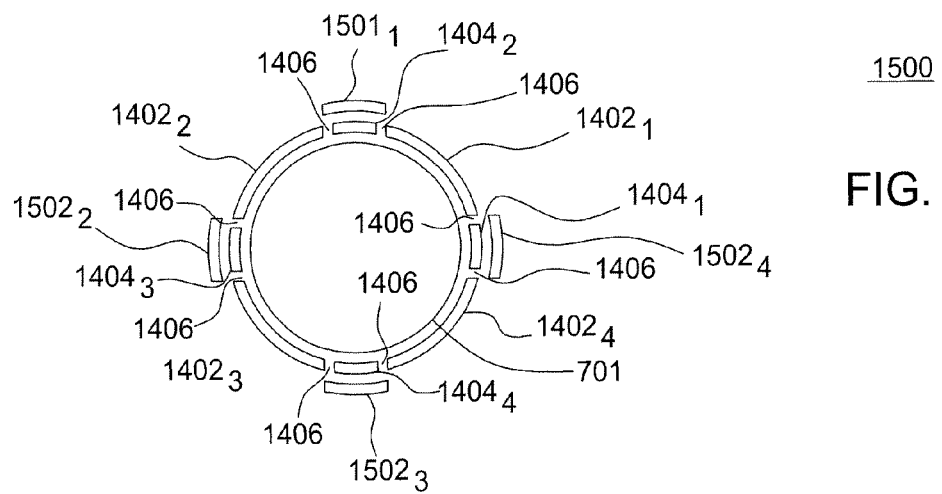

FIG. 17 depicts a top view of an embodiment of a magnetic coil configuration 1500 to circumscribe a process chamber 701. The magnetic coil configuration 1500 contains main magnetic coils $1402_1$, $1402_2$, $1402_3$, and $1402_4$ (collectively main magnetic coils 1402); sub-magnetic coils $1404_1$, $1404_2$, $1404_3$, and $1404_4$ (collectively sub-magnetic coils 1404); and sub-magnetic coils $1502_1$, $1502_2$, $1502_3$, and $1502_4$ (collectively sub-magnetic coils 1502). Each of the main magnetic coils 1402 and sub-magnetic coils 1404 is curved, in the same plane, and alternatively positioned end to end. A space 1406 is formed between each alternatively positioned main magnetic coil 1402 and sub-magnetic coil 1404. The sub-magnetic coils 1502 are juxtaposed (i.e., substantially parallel) to the sub-magnetic coils 1404. The area covered by a main magnetic coil 1402 and a sub-magnetic coil 1404 is about 90° of the circumference of the process chamber 701. The addition of the sub-magnetic coils 1502 increases the magnetic field by providing a magnetic field additive to the magnetic field provided by sub-magnetic coils 1404. In this embodiment, twelve currents can be applied to achieve substantial improvement in the control of the magnetic field shape. Alternatively, the sub-magnetic coils can be wired in series with the adjacent main coils as described with respect to FIG. 7A such that only four current supplies are used to drive the configuration.

Figure 18A:
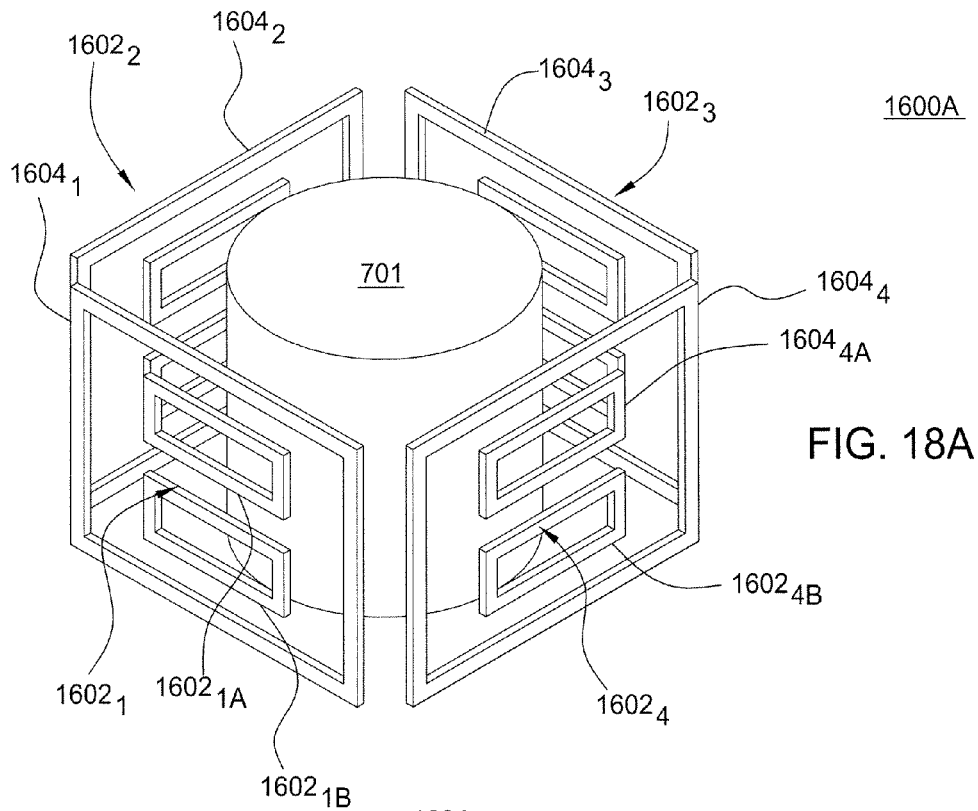
FIGS. 18A-18B depict perspective views of coil configurations having horizontal sub-magnetic coils in accordance with embodiments of the present invention.

FIG. 18A depicts a perspective view of another embodiment of a magnetic coil configuration 1600A to circumscribe a process chamber 701. The magnetic coil configuration 1600 comprises main magnetic coils $1604_1$, $1604_2$, $1604_3$, and $1604_4$ (collectively main magnetic coils 1604) and sub-magnetic coil pairs $1602_1$, $1602_2$, $1602_3$, and $1602_4$ (collectively sub-magnetic coils 1602). In this embodiment, the pairs of sub-magnetic coils 1602 are aligned with an associated center of the main coil 1604. The sub-magnetic coils 1602 are located near the top and bottom of the associated main coil. The sub-magnetic coils $1602_1$, $1602_2$, $1602_3$, and $1602_4$ provide a corrective magnetic field to improve the shape of the magnetic field in the chamber. The main magnetic coils may overlap as shown in previous embodiments discussed herein.

Figure 18B:
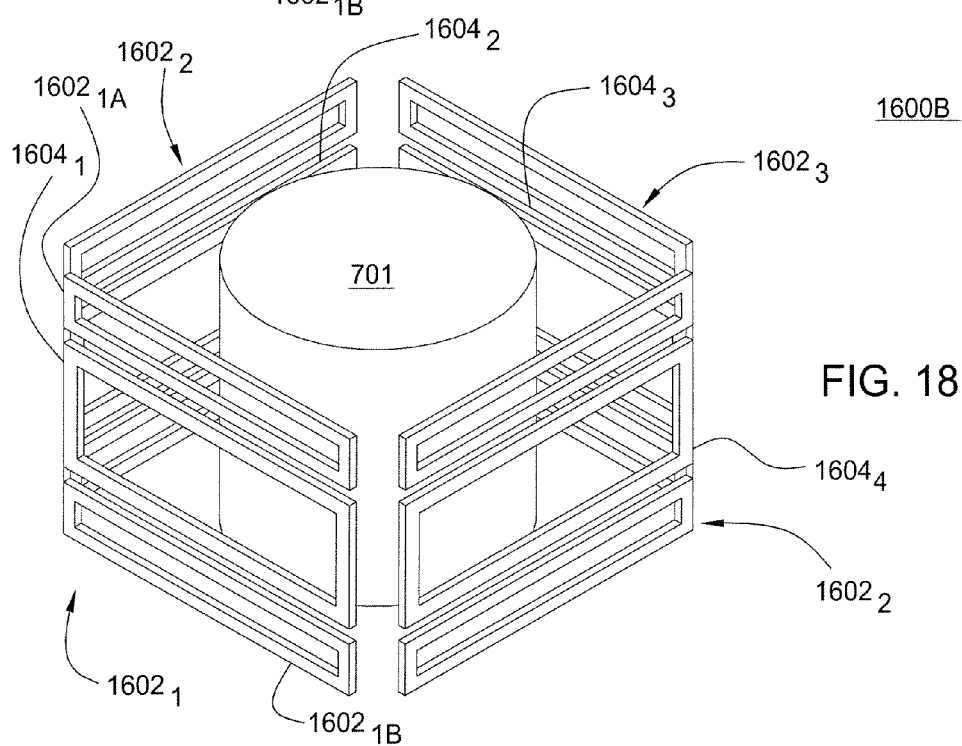

FIG. 18B is a perspective view of an embodiment of the invention having a coil configuration 1600B that is similar to FIG. 18A except the horizontal sub-magnetic coils 1602 are positioned outside the area circumscribed by the main magnetic coil 1604.

Figure 19A:
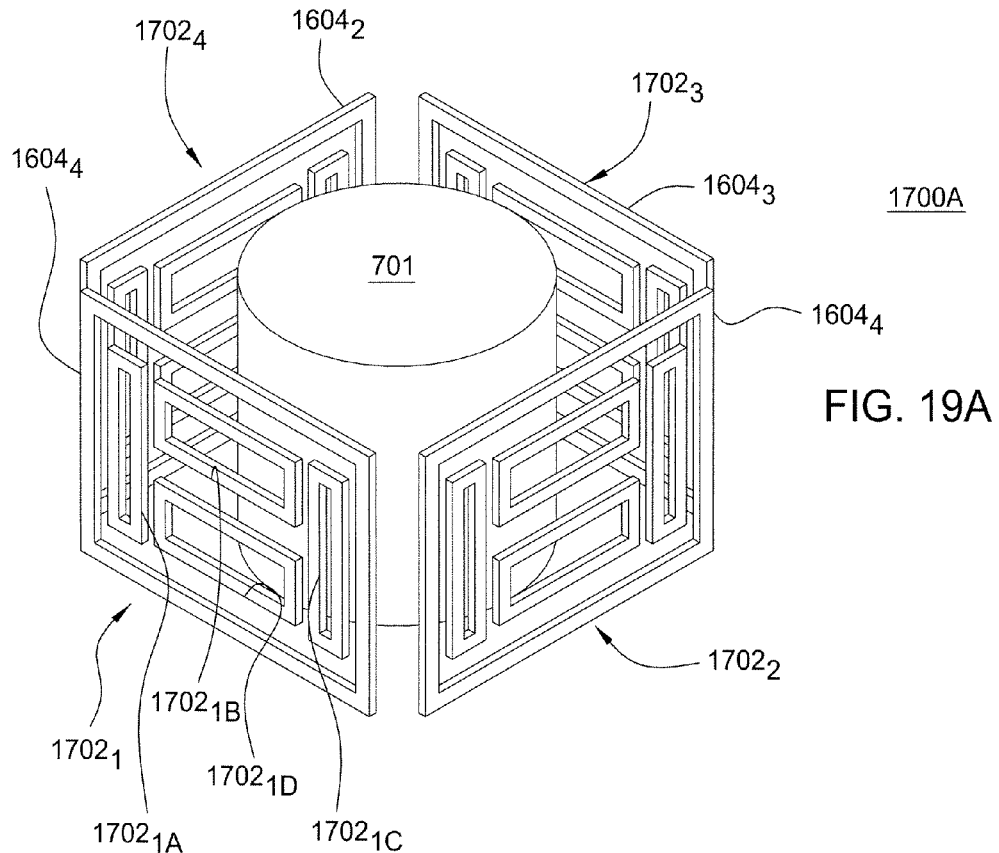
FIGS. 19A-19C depict perspective views of coil configurations having vertical and horizontal sub-magnetic coils in accordance with embodiments of the present invention.

FIG. 19A depicts perspective view of another embodiment of a magnetic coil configuration 1700A to circumscribe a process chamber 701. The magnetic coil configuration 1700 contains main magnetic coils $1604_1$, $1604_2$, $1604_3$, and $1604_4$ (collectively main magnetic coils 1604); and vertical and horizontal sub-magnetic coil sets $1702_1$, $1702_2$, $1702_3$, and $1702_4$ (collectively sub-magnetic coil pairs 1702). Each coil set, for example, contains two horizontal coils (e.g., coils $1702_{1B}$ and $1702_{1D}$) and two vertical coils (e.g., $1702_{1A}$ and $1702_{1C}$). By driving each of these twenty coils with separate currents provides for substantial control over the shape of the magnetic field produced in the chamber. The twenty coils also provides flexibility in producing a magnetic field shape that optimizes processing of the substrate. Alternatively, fewer than twenty currents could be used by connecting various sub-sets of coils in series, such as those shown in FIG. 7A. Also, alternatively, the main coils may overlap as shown in previous embodiments discussed herein.

Figure 19B:
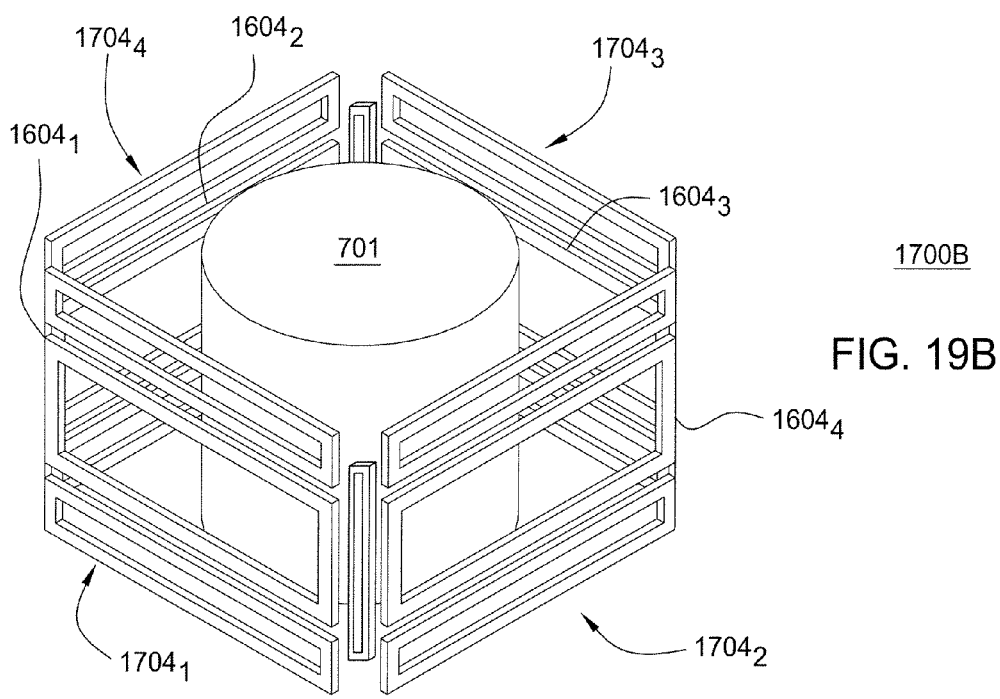

FIG. 19B depicts a perspective view of an embodiment of the invention having a coil configuration 1700B that is similar to FIG. 19A except the vertical and horizontal sub-magnetic coils 1704 are positioned outside the area circumscribed by the main magnetic coil 1604. In a further embodiment, not shown, a combination of coils within the main coils and outside the main coils is also contemplated.

Figure 19C:
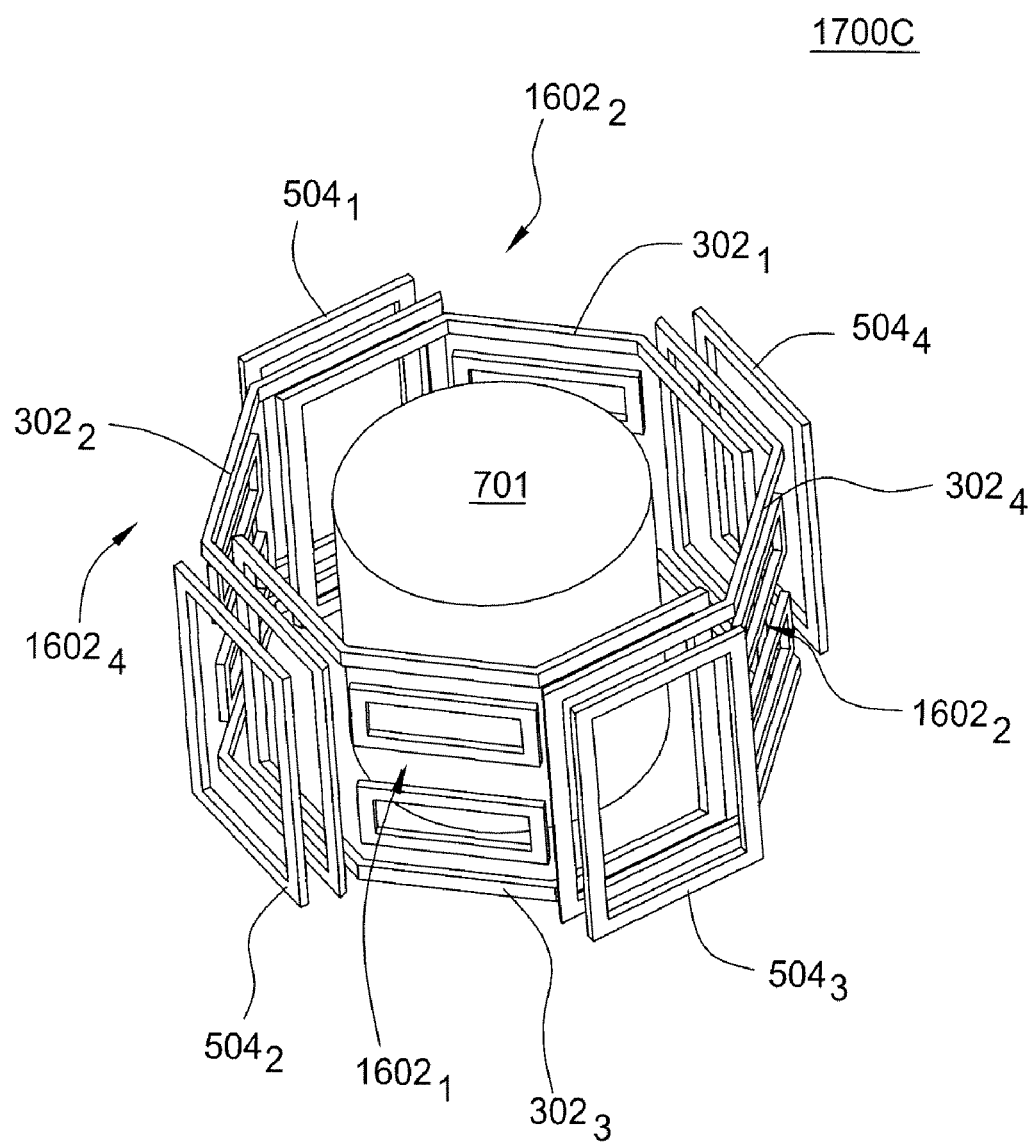

FIG. 19C depicts a perspective view of an embodiment of the invention having a coil configuration 1700C that combines the features of FIG. 5 and FIG. 18A. Specifically, the configuration 1700C comprises a chamber 701 surrounded by four main magnetic coils $302_1$, $302_2$, $302_3$, $302_4$, four vertical sub-magnetic coils $604_1$, $604_2$, $604_3$, and $604_4$ and eight horizontal sub-magnetic coils $1602_1$, $1602_2$, $1602_3$, $1602_4$. Each of the four vertical sub-magnetic coils $504_1$, $504_2$, $504_3$, and $504_4$ are positioned proximate the overlap of the main magnetic coils $302_1$, $302_2$, $302_3$, $302_4$. The horizontal sub-magnetic coils $1602_1$, $1602_2$, $1602_3$, $1602_4$ are positioned as coil pairs, where one coil in the pair is positioned near the top of the main coil and one coil in the pair is positioned near the bottom of the main coil. Sixteen currents may be used to independently drive each coil. Alternatively, the configuration may be driven with as few as four currents. To accomplish a four current system, the vertical sub-magnetic coils $502_1$, $502_2$, $502_3$, $502_4$ are double wound and five coils are wired in series to be driven by a single coil. For example, one-half of the double wound winding of coils $504_2$ and $504_3$ are connected in series with coil pair $1602_1$, and main coil $302_3$. The number of turns in each sub-magnetic coil is predetermined to best shape the magnetic field produced by the main magnetic coils.

Figure 20A:
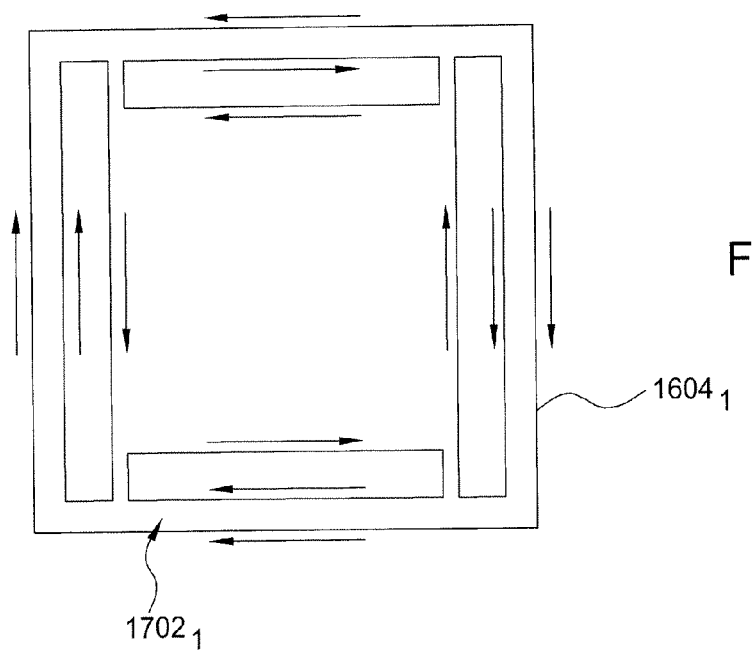
Figure 20B:
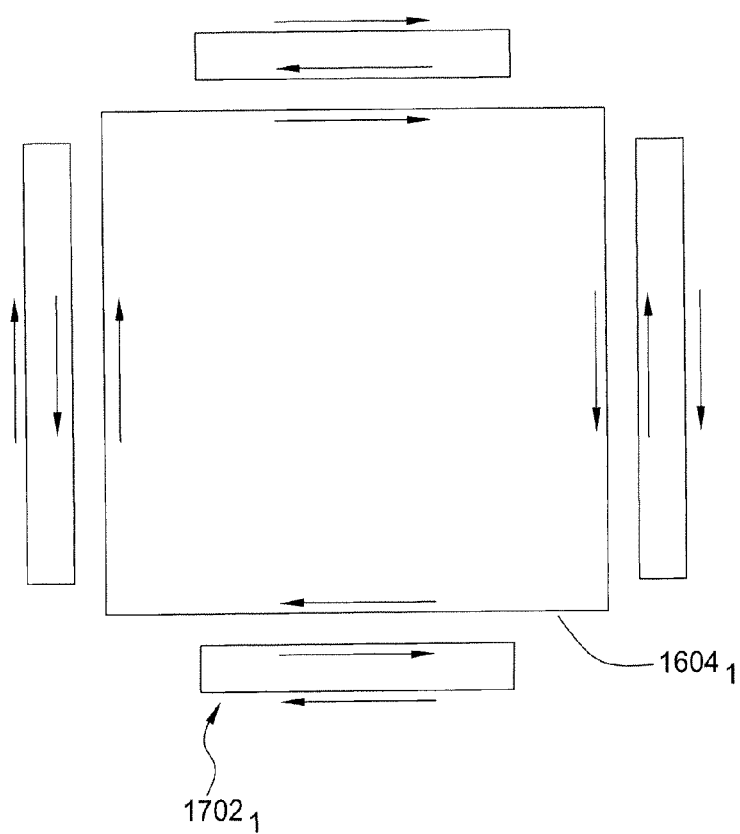

FIG. 20A depicts a side view of the embodiment of FIG. 19A where the sub-magnetic coils 1702 are positioned inside the main coil 1604. As such, the currents (shown as arrows) in the sub-magnetic coils 1702 are flowing in the same direction as the current in the main coil 1604, meaning that all of the currents for the individual coils are shown moving in the clockwise direction. Thus, all of the magnetic fields generated by these five coils are pointed in the same direction, which is into the page, and are thus vectorally additive. In addition, within the portion of each sub-coil directly adjacent to the single main coil depicted, the direction of current flow is the same as for the main coil. In contrast, FIG. 20B depicts a side view of the embodiment depicted in FIG. 19B, where the sub-magnetic coils $1704_1$ are outside the main magnetic coil $1604_1$. As in FIG. 20A, the currents in the sub-magnetic coils 1702 are flowing in the same direction as the current in the main coil 1604, meaning that all of the currents for the individual coils are shown moving in the clockwise direction. Thus, all of the magnetic fields generated by these five coils are pointed in the same direction, which is into the page, and are thus vectorally additive. However since the sub-coils are located outside of the main coil, within the portion of each sub-coil directly adjacent to the single main coil depicted, the direction of current flow is the opposite as for the main coil. From a design point of view, this means that, to produce the same corrective magnetic field over the workpiece, fewer turns of wire would be necessary to create the sub-magnetic coils 1604 of embodiment of FIG. 19A as compared to the sub-magnetic coils 1704 of the embodiment of FIG. 19B.

Figure 21:
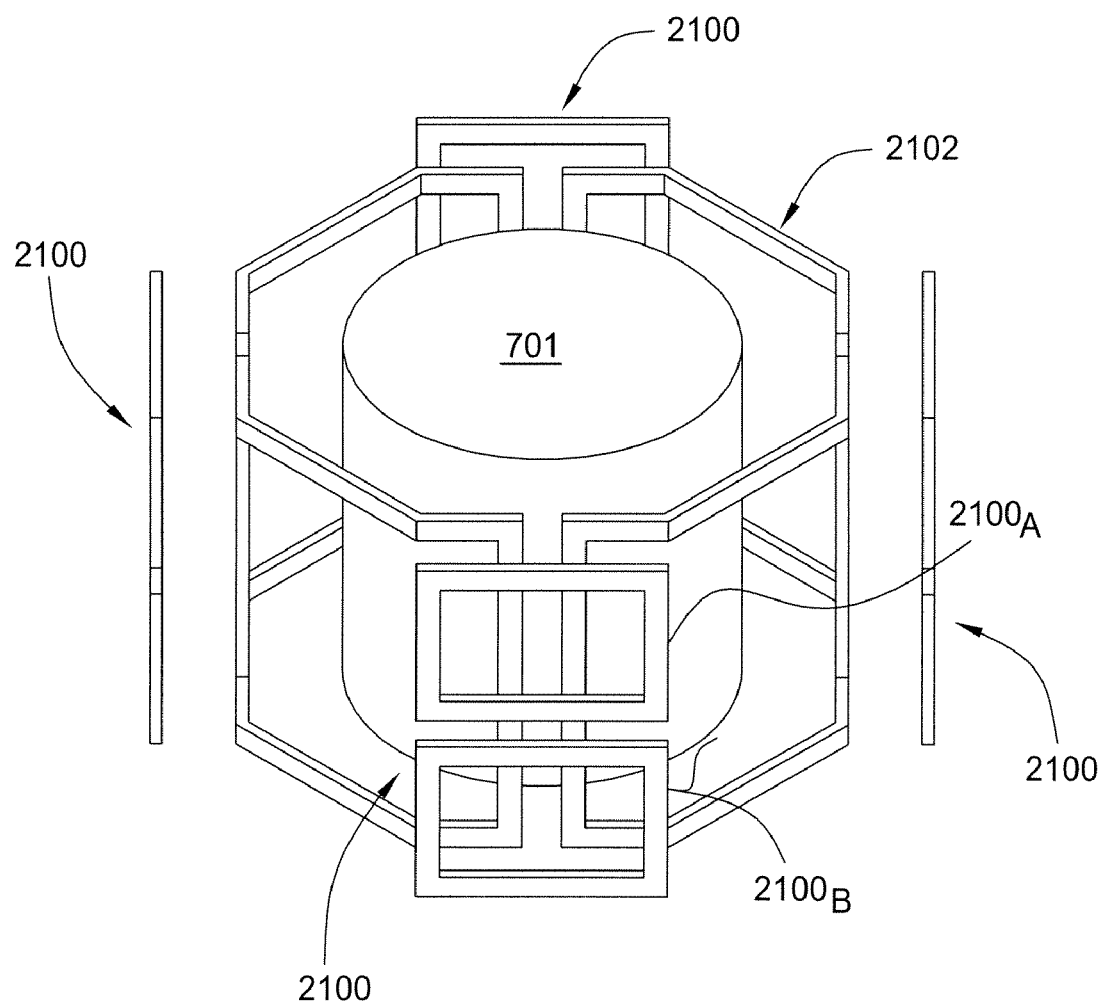
FIG. 21 depicts a perspective view of yet another magnetic coil configuration in accordance with the invention.

FIG. 21 depicts a perspective view of another embodiment of the present invention. In this embodiment, the sub-magnetic coils 2100 are divided into two coils 2100A and 2100B that are stacked vertically on four sides of the chamber 701. This embodiment depicts the main magnetic coils 2102 covering 180 degrees of the chamber circumference and having the centers of the main and sub-magnetic coils aligned. The division of the sub-magnetic coils 2100 into two portions enables twelve currents to be used to establish the magnetic field shape. The configurations of other main magnetic coils discussed herein may also be used. In this embodiment, twelve currents can be applied to achieve substantial improvement in the control of the magnetic field shape. Alternatively, the sub-magnetic coils can be wired in series with the adjacent main coils such that only four current supplies are used to drive the configuration, e.g., wire together the pair of sub-coils immediately above and below each other with the one main coils that they are adjacent to and share the same coil centerpoint.

Figure 22H:
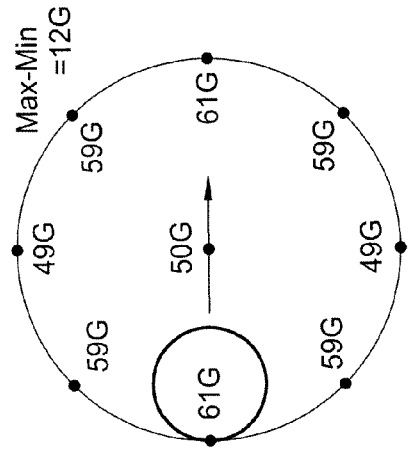

A number of simulations have been performed with respect to the various embodiments of the invention discussed above. FIGS. 22A-22K each depict a magnetic field gradient produced by the prior art as well as the foregoing embodiments of the invention. FIG. 22A depicts the magnetic field gradient produced by the embodiment of FIG. 2 where two adjacent main coils are energized. Note that the field gradient slopes from 85G to 10G. FIG. 22B depicts the magnetic field gradient produced by the embodiment of FIG. 3 when two adjacent main coils are energized. Here, the extended width coils reduce the high field strength side to 75G, maintain the center field strength at 35G and increases the low field strength side to 12G. As such, the extended coils "flatten" the gradient of the magnetic field.

FIG. 22C depicts the field that is produced by the embodiment of FIG. 5 where two adjacent main coils and two opposite sub-magnetic coils are energized. Here, the gradient is further flattened and the high field side has a magnitude that is adjustable with the current magnitude to the sub-magnetic coils. FIG. 22D depicts the field strength produced by the embodiment of FIG. 11 having two adjacent main coils and two adjacent sub-magnetic coils energized. This embodiment produces a substantially uniform magnetic field with the high magnetic field value being adjustable with sub-magnetic coil current. FIG. 22E depicts the magnetic field produced by the embodiment of FIG. 19C having two adjacent main magnetic field coils and the four upper and lower sub-magnetic coils and the two opposite corner coils are energized. The magnetic field has a well defined gradient and the high value side is controllable with the sub-magnetic coil currents. Thus, the progression from FIG. 22A, to 22B, to 22C to 22E shows that the overlapping of the main coils plus the addition of the corner coils plus the addition of the upper and lower coils modifies the high field end from 85G down to 60G, while keeping the same 35G in the center of the workpiece and while keeping the lower field strength between 10G and 15G. This reduction in the field strength at the high field end has been shown to improve both the instantaneous etch rate uniformity and the time-averaged (magnetic field rotated) etch rate uniformity. Further control of the field strength at the low field end is achieved by using currents in the second pair of main coils. In addition, the magnetic field value at the high field end of the workpiece is fully controllable (e.g., 85G, 70G, 60G, 55G, etc.) by controlling the relative currents in each of the coils to achieve the desire field shape.

Figure 1:
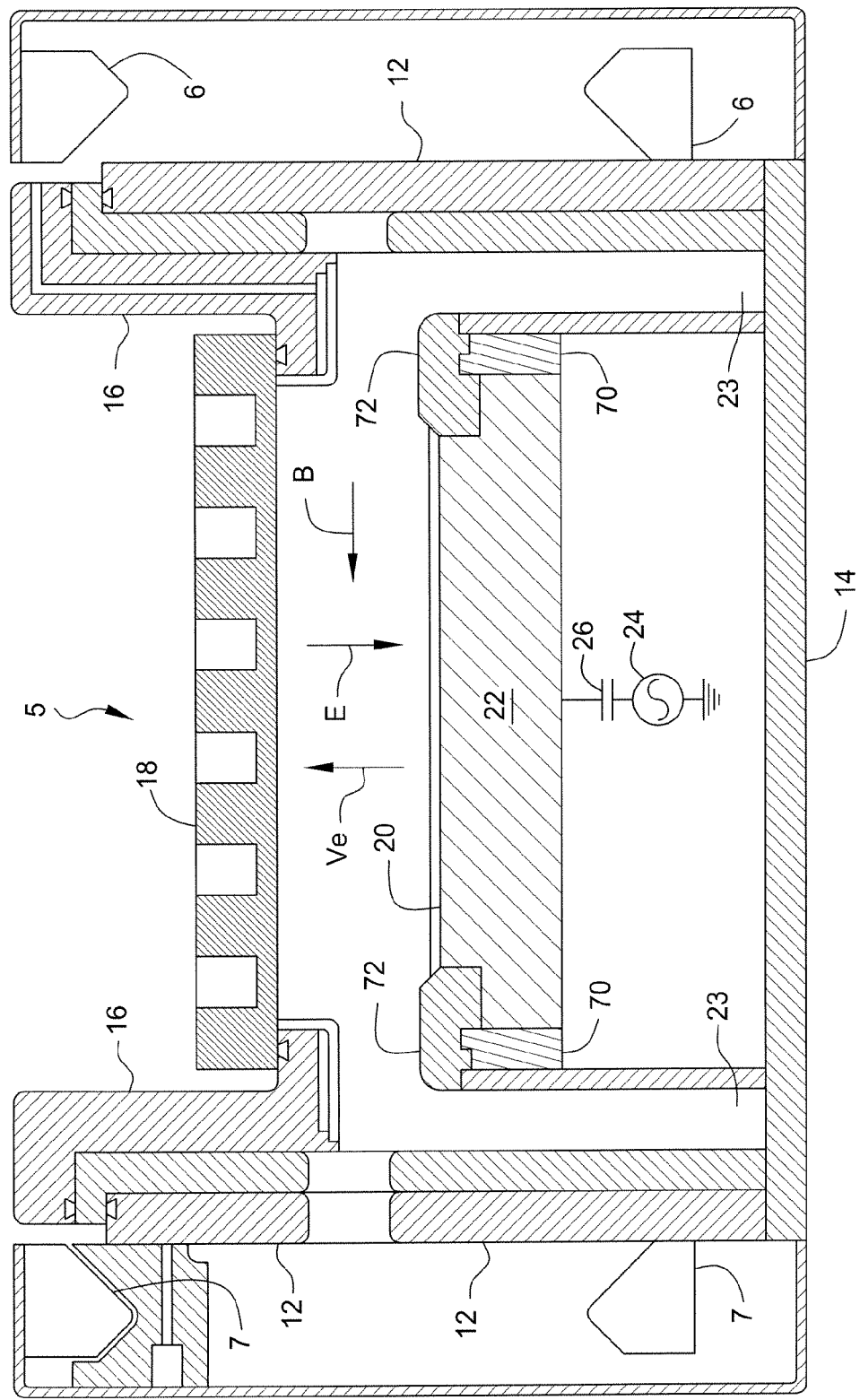
FIG. 1 is a side cross-sectional view of a conventional dry etching chamber.
Figure 2:
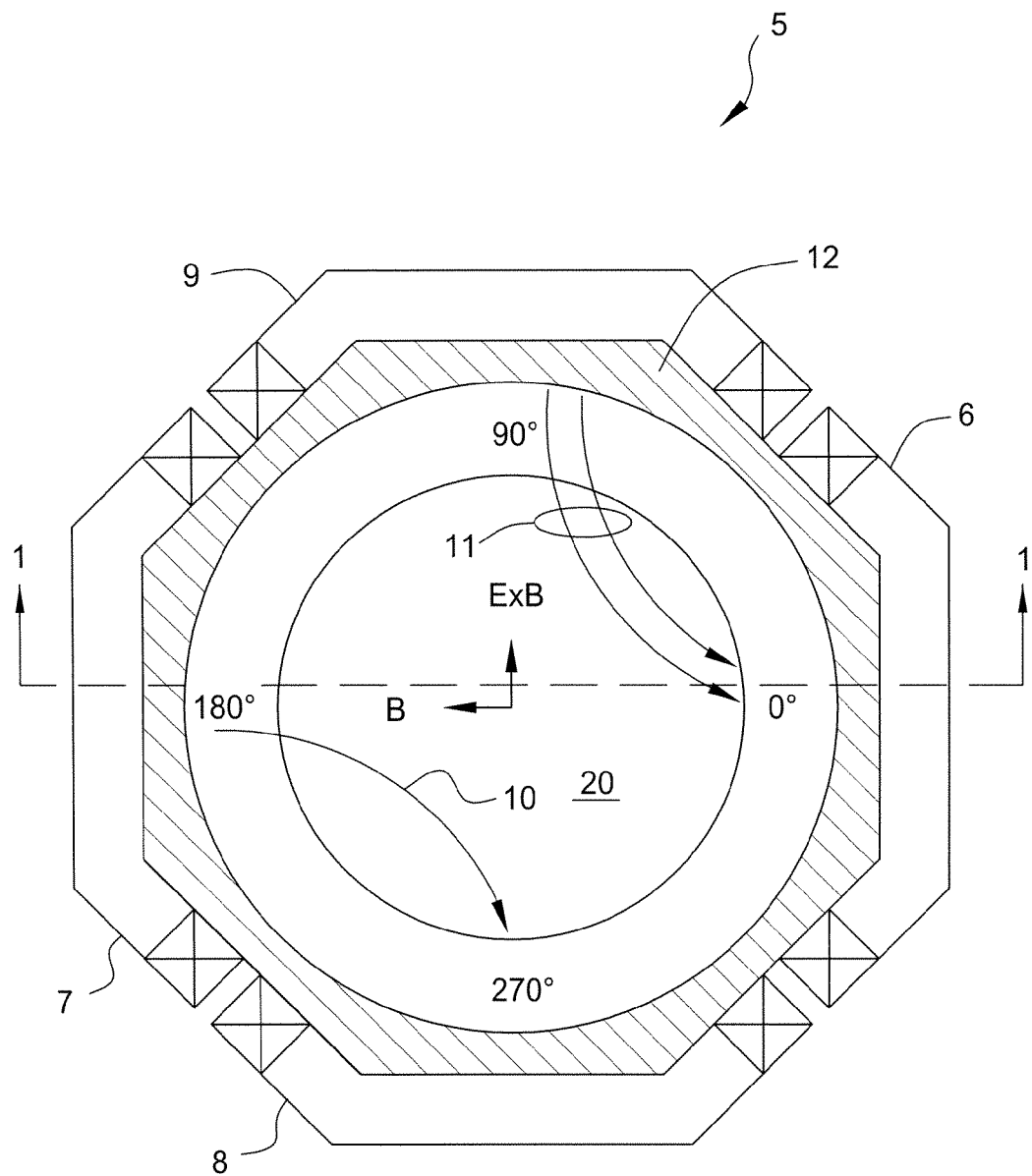
FIG. 2 is a top cross-sectional view of a magnetic field generator of the dry etching chamber shown in FIG. 1.
Figure 22K:
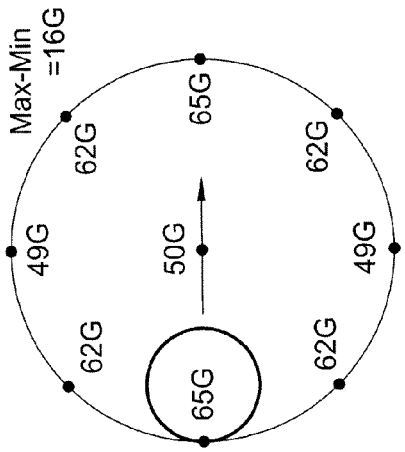
Figure 22G:
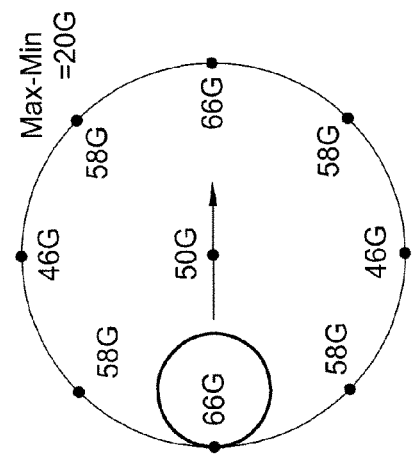
Figure 22J:
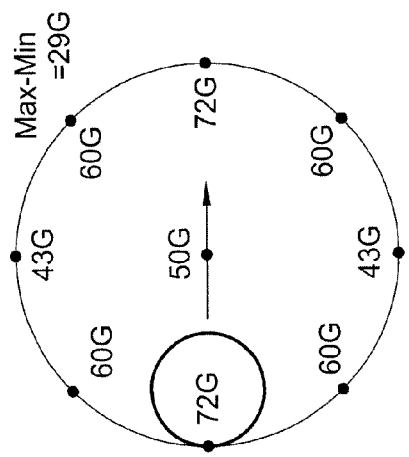
Figure 22F:
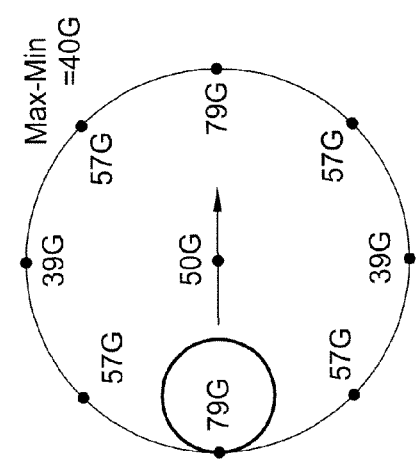
Figure 22I:
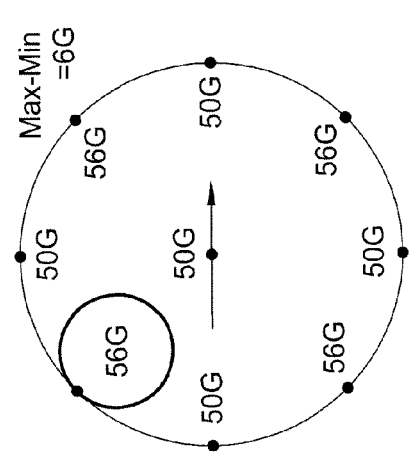

FIG. 22F depicts a magnetic field that is generated by the prior art of FIG. 2 where two, opposite coils are energized. Note that that the magnetic field magnitude is not very uniform across the substrate, i.e., the field magnitude varies from 79G to 39G, a range of 40G for a field strength of 50G at the center of the substrate. FIG. 22G depicts the magnetic field that is produced by the embodiment of FIG. 3 where two, opposite extended width coils are energized. The uniformity of the magnetic field is improved over the magnetic field of FIG. 22F. FIG. 22H depicts the magnetic field produced by the embodiment of FIG. 5 having two, opposite main coils and four sub-magnetic coils energized. The result is an improved uniformity of the magnetic field. When upper and lower coils are added as in the embodiment of FIG. 19C and these coils are energized, the result is the magnetic field of FIG. 22I. The magnetic field is now almost completely uniform. Thus, the progression from FIG. 22F, to 22G, to 22H to 22I shows that the overlapping of the main coils plus the addition of the corner coils plus the addition of the upper and lower coils improves the uniformity of the field strength, from a range of 40G to a range of 6G, all for a center field strength of 50G. Further improvement over the results could be obtained by further modification of the shapes and locations of each of the coils, the addition of more coils, and the fine tuning of the currents energizing all of the appropriate coils.

FIG. 22J depicts the magnetic field produced by the embodiment of FIG. 11 where all four of the 180 degree main coils are energized. This embodiment shows improvement over the magnetic field of the prior art (FIG. 22F). When the sub-magnetic coils are also energized, the magnetic field uniformity is further improved as shown in FIG. 22K.

Thus, from these simulations, the use of extended width coils improves the shape of the magnetic fields produced in the chamber. To further improve the shape of the fields, additional coils that provide corrective fields can be used.

Furthermore, while the semiconductor wafer processing chamber is a dry etching chamber in the above embodiments, it is a matter of course that the present invention is applicable to other types of semiconductor wafer processing chambers such as a CVD chamber in which the plasma formation is accelerated by the use of electromagnets.

While foregoing is directed to various embodiments of the present invention, other and further embodiments of the invention may be devised without departing from the basic scope thereof, and the scope thereof is determined by the claims that follow.

The invention claimed is:

1. A magnetic field generator for generating a magnetic field within a semiconductor substrate processing system comprising:
    a process chamber having a substrate support disposed therein, the substrate support having a support surface perpendicular to a central axis of the substrate support;
    a plurality of first coils disposed circumferentially about the process chamber and that form a first magnetic field having a convex shape proximate a substrate support surface of the substrate support; and
    a plurality of second coils disposed circumferentially about the process chamber and positioned proximate to the plurality of first coils, the plurality of second coils for providing a second magnetic field having a concave shape, where a combination of the first magnetic field and the second magnetic field form a magnetic field having a desired shape;
    wherein each coil of the plurality of first coils and the plurality of second coils have central axes that are substantially radially aligned with and perpendicular to the central axis of the substrate support.

2. The magnetic field generator of claim 1, wherein the plurality of first coils and the plurality of second coils each equal an even number of at least four coils.

3. The magnetic field generator of claim 2, further comprising:
    eight current sources, each one of the current sources coupled to a different at least one of the plurality of first coils and the plurality of second coils.

4. The magnetic field generator of claim 1, wherein the combination of the first magnetic field and the second magnetic field form a magnetic field generally parallel to a top surface of a substrate support about which the coils are disposed.

5. The magnetic field generator of claim 1, wherein the combination of the first magnetic field and the second magnetic field form a magnetic field having a desired contour with respect to a top surface of a substrate support about which the coils are disposed.

6. The magnetic field generator of claim 1, wherein the plurality of second coils further comprise:

a plurality of sets of second coils wherein each set of second coils is disposed proximate adjacent ends of two first coils in the plurality of first coils, wherein each set comprises at least one second coil having a central axis disposed above a support surface of a substrate support disposed in a chamber about which the second coils are disposed and at least one second coil having a central axis disposed below the support surface of the substrate support.

7. The magnetic field generator of claim 1, wherein the plurality of second coils further comprise:

a plurality of sets of second coils wherein each set of second coils is disposed proximate adjacent ends of two first coils in the plurality of first coils, wherein each set further comprises at least one second coil having a central axis disposed approximately level with a support surface of a substrate support disposed in a chamber about which the second coils are disposed.

8. The magnetic field generator of claim 1, wherein the plurality of second coils further comprise:

a plurality of sets of second coils wherein each set of second coils is disposed proximate adjacent ends of two first coils in the plurality of first coils, wherein a central axis of each of the second coils is approximately level with a support surface of a substrate support disposed in a chamber about which the second coils are disposed.

* * * * *